US012677553B2

(12) United States Patent
Zhao et al.

(10) Patent No.: US 12,677,553 B2
(45) Date of Patent: Jul. 7, 2026

(54) DISPLAY PANEL AND DISPLAY DEVICE WITH REDUCED CROSS-VOLTAGE BETWEEN SOURCE AND DRAIN

(71) Applicants: Chengdu BOE Optoelectronics Technology Co., Ltd., Chengdu (CN); BOE Technology Group Co., Ltd., Beijing (CN)

(72) Inventors: Pan Zhao, Beijing (CN); Jingwen Zhang, Beijing (CN); Zhiliang Jiang, Beijing (CN); Ziyang Yu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 401 days.

(21) Appl. No.: 18/275,020

(22) PCT Filed: Apr. 20, 2022

(86) PCT No.: PCT/CN2022/087910
§ 371 (c)(1),
(2) Date: Jul. 31, 2023

(87) PCT Pub. No.: WO2023/201570
PCT Pub. Date: Oct. 26, 2023

(65) Prior Publication Data
US 2025/0008788 A1      Jan. 2, 2025

(51) Int. Cl.
*H10K 59/131* (2023.01)
*H10K 59/121* (2023.01)
(52) U.S. Cl.
CPC ....... *H10K 59/131* (2023.02); *H10K 59/1213* (2023.02)

(58) Field of Classification Search
CPC ............ H10K 59/1213; H10K 59/131; H10K 59/1216; H10K 59/12; G09G 3/3233;
(Continued)

(56) References Cited

U.S. PATENT DOCUMENTS 7,345,730 B2    3/2008  Kim et al.
9,875,690 B2    1/2018  Wang et al.
(Continued)

FOREIGN PATENT DOCUMENTS

CN    104299572 A    1/2015
CN    106972043 A    7/2017
(Continued)

OTHER PUBLICATIONS

International Search Report issued Jan. 4, 2023 in International Application No. PCT/CN2022/087910, 4 pages.
(Continued)

*Primary Examiner* — John P. Dulka
(74) *Attorney, Agent, or Firm* — XSENSUS LLP

(57) ABSTRACT
A display panel and a display device are provided. The display panel includes sub pixel units arranged in an array along a first direction (X) and a second direction (Y) intersecting with the first direction (X). The display panel further includes a base substrate (81), a second conductive layer, a fourth conductive layer, and a common electrode layer (6). The second conductive layer includes multiple first conductive parts (21). The first conductive part (21) is arranged in correspondence with the pixel driving circuit. The first conductive part (21) is used to form the first electrode of the capacitor (C) in the pixel driving circuit corresponding thereto. The fourth conductive layer includes multiple first power lines (VSS). Orthographic projections of the first power lines (VSS) on the base substrate (81) are
(Continued)

distributed in a spaced manner along the first direction (X) and extend along the second direction (Y).

20 Claims, 18 Drawing Sheets

(58) Field of Classification Search
CPC ... G09G 2300/0819; G09G 2300/0842; G09G 3/3266; G09G 3/3225; H10D 86/60; H10D 86/441; H10D 30/6717
See application file for complete search history.

(56) References Cited

U.S. PATENT DOCUMENTS

| | | | | |
|---|---|---|---|---|
| 10,431,643 | B2 | 10/2019 | Kang et al. | |
| 10,580,845 | B2 * | 3/2020 | Kim | H10D 86/441 |
| 10,657,898 | B2 * | 5/2020 | Qian | G09G 3/3258 |
| 11,917,879 | B2 * | 2/2024 | Jo | H10K 59/35 |
| 2005/0094082 | A1 | 5/2005 | Kim et al. | |
| 2009/0102759 | A1 * | 4/2009 | Kawabe | G09G 3/3258 |
| | | | | 345/76 |
| 2010/0182223 | A1 | 7/2010 | Choi et al. | |
| 2016/0293105 | A1 | 10/2016 | Wang et al. | |
| 2017/0207289 | A1 | 7/2017 | Kang et al. | |
| 2021/0183982 | A1 | 6/2021 | Li et al. | |
| 2022/0328608 | A1 | 10/2022 | Li et al. | |

FOREIGN PATENT DOCUMENTS

| | | |
|---|---|---|
| CN | 113327543 A | 8/2021 |
| CN | 114023761 A | 2/2022 |
| CN | 114038415 A | 2/2022 |
| EP | 3 217 385 A1 | 9/2017 |
| EP | 4 020 596 A1 | 6/2022 |
| KR | 10-2010-0086256 A | 7/2010 |
| KR | 10-1048965 B1 | 7/2011 |

OTHER PUBLICATIONS

Written Opinion of the International Searching Authority issued Jan. 4, 2023 in International Application No. PCT/CN2022/087910, 4 pages.

* cited by examiner

6

DISPLAY PANEL AND DISPLAY DEVICE WITH REDUCED CROSS-VOLTAGE BETWEEN SOURCE AND DRAIN

CROSS REFERENCE TO RELATED APPLICATION

The present disclosure is the U.S. national phase application of International Application No. PCT/CN2022/087910 filed on Apr. 20, 2022, the content of which is incorporated herein by reference in its entirety for all purposes.

TECHNICAL FIELD

The present disclosure relates to the field of display technology, in particular to a display panel and a display device.

BACKGROUND

A pixel circuit in a display panel in related technologies typically includes a driving transistor. A large cross-voltage needs to be applied between a source electrode and a drain electrode of the driving transistor so that the driving transistor can be operated in a saturation region. It is necessary to provide a larger power supply voltage for the display panel to achieve normal driving, resulting in a higher power consumption of the display panel.

It should be noted that information disclosed in above section is only used to enhance the understanding of the background of the present disclosure, and thus information that does not constitute the prior art known to those of ordinary skill in the art may be included.

SUMMARY

According to one aspect of the present disclosure, a display panel is provided. The display panel includes sub pixel units arranged in an array along a first direction and a second direction intersecting with the first direction, wherein the sub pixel unit includes a pixel driving circuit and a light-emitting unit, the pixel driving circuit is connected to a first electrode of the light-emitting unit, the pixel driving circuit includes a driving transistor and a capacitor, a first electrode of the capacitor is connected to a first power line, and a second electrode of the capacitor is connected to a gate of the driving transistor. The display panel further includes a base substrate, a second conductive layer, a fourth conductive layer, and a common electrode layer; the second conductive layer is located on a side of the base substrate, wherein the second conductive layer includes multiple first conductive parts, the first conductive part is arranged in correspondence with the pixel driving circuit, and the first conductive part is used to form the first electrode of the capacitor in the pixel driving circuit corresponding thereto; the fourth conductive layer is located on a side of the second conductive layer away from the base substrate, wherein the fourth conductive layer includes multiple first power lines, orthographic projections of the first power lines on the base substrate are distributed in a spaced manner along the first direction and extend along the second direction, and the first conductive part is connected to the first power line through a via hole; and the common electrode layer is located on a side of the fourth conductive layer away from the base substrate, wherein the common electrode layer is used to form a second electrode of the light-emitting unit, and the first power line is connected to the common electrode layer through a via hole.

In some embodiments of the present disclosure, at least a portion of the first conductive parts arranged along the first direction are connected in sequence to form a first conductive line, and the first conductive line is connected to the multiple first power lines.

In some embodiments of the present disclosure, all of the first conductive parts arranged along the first direction are connected in sequence to form the first conductive line, and the first conductive line is connected to each of the first power lines.

In some embodiments of the present disclosure, multiple of the first conductive parts arranged along the first direction form multiple first conductive lines distributed in a spaced manner along the first direction, and wherein two first conductive lines adjacent in both the first direction and the second direction are distributed in an interlaced manner along the first direction, and the two first conductive lines distributed in an interlaced manner are jointly connected to at least two of the first power lines.

In some embodiments of the present disclosure, the pixel driving circuit further includes a sixth transistor, a first electrode of the sixth transistor is connected to a second electrode of the driving transistor, a second electrode of the sixth transistor is connected to the first electrode of the light-emitting unit, and the sixth transistor is a P-type transistor, and wherein the first power line is used to provide a low-level power supply signal. The display panel further includes: an active layer located between the base substrate and the second conductive layer, wherein the active layer includes a sixth active part, and the sixth active part is used to form a channel region of the sixth transistor, and wherein the orthographic projections of the first power lines on the base substrate at least partially overlap with an orthographic projection of the sixth active part on the base substrate.

In some embodiments of the present disclosure, the pixel driving circuit further includes a second transistor, a first electrode of the second transistor is connected to the gate of the driving transistor, and a second electrode of the second transistor is connected to a second electrode of the driving transistor. The second conductive layer further includes a second conductive part connected to a stable power supply terminal. The display panel further includes: an active layer located between the base substrate and the second conductive layer, wherein the active layer includes a second active part and a third sub active part, and the second active part includes a first sub active part and a second sub active part, and wherein the third sub active part is connected between the first sub active part and the second sub active part, the first sub active part is used to form a first channel region of the second transistor, and the second sub active part is used to form a second channel region of the second transistor, and wherein an orthographic projection of the second conductive part on the base substrate at least partially overlaps with an orthographic projection of the third sub active part on the base substrate.

In some embodiments of the present disclosure, a first electrode of the driving transistor is connected to a second power line, and the second conductive part is connected to the second power line through a via hole. The second conductive layer includes multiple second conductive parts, the second conductive part is arranged in correspondence with the pixel driving circuit, and at least a portion of the second conductive parts arranged along the first direction are connected in sequence to form a second conductive line. The display panel further includes multiple second power lines, orthographic projections of the multiple second power lines on the base substrate are distributed in a spaced manner along the first direction and extend along the second direction, and the second conductive line is connected to the multiple second power lines.

In some embodiments of the present disclosure, the pixel driving circuit further includes a first transistor, a first electrode of the first transistor is connected to a first initial signal line, and a second electrode of the first transistor is connected to the gate of the driving transistor. The active layer further includes a first active part and a third active part, the first active part is used to form a channel region of the first transistor, and the third active part is used to form a channel region of the driving transistor. The display panel further includes a first conductive layer located between the active layer and the second conductive layer, wherein the first conductive layer includes a first reset signal line, a gate line, and a third conductive part; an orthographic projection of the first reset signal line on the base substrate extends along the first direction and covers an orthographic projection of the first active part on the base substrate, and a portion of a structure of the first reset signal line is used to form a gate of the first transistor; an orthographic projection of the gate line on the base substrate extends along the first direction and covers an orthographic projection of the second active part on the base substrate, and a portion of a structure of the gate line is used to form a gate of the second transistor; and an orthographic projection of the third conductive part on the base substrate covers an orthographic projection of the third active part on the base substrate, and the third conductive part is used to form the gate of the driving transistor; wherein the orthographic projection of the first reset signal line on the base substrate is located on a side where the orthographic projection of the gate line on the base substrate is away from the orthographic projection of the third conductive part on the base substrate, and the orthographic projection of the second conductive part on the base substrate is located between the orthographic projection of the first reset signal line on the base substrate and the orthographic projection of the gate line on the base substrate.

In some embodiments of the present disclosure, the display panel further includes a third conductive layer located between the second conductive layer and the fourth conductive layer, wherein the third conductive layer includes a first bridging part, and the first bridging part is connected to the third conductive part and the first electrode of the second transistor through a via hole. The second conductive part includes: a first sub conductive part, wherein an orthographic projection of the first sub conductive part on the base substrate extends along the first direction, and is located between an orthographic projection of the first bridging part on the base substrate and the orthographic projection of the first reset signal line on the base substrate.

In some embodiments of the present disclosure, the display panel further includes a data line, wherein an orthographic projection of the data line on the base substrate extends along the second direction. The second conductive part further includes: a second sub conductive part connected to the first sub conductive part, wherein an orthographic projection of the second sub conductive part on the base substrate extends along the second direction, and is located between the orthographic projection of the first bridging part on the base substrate and the orthographic projection of the data line on the base substrate.

In some embodiments of the present disclosure, the driving transistor is connected to a second power line, and the pixel driving circuit further includes a second transistor and a fourth transistor, and wherein a first electrode of the second transistor is connected to the gate of the driving transistor, a second electrode of the second transistor is connected to a second electrode of the driving transistor, a first electrode of the fourth transistor is connected to a data line, and a second electrode of the fourth transistor is connected to a first electrode of the driving transistor. The display panel further includes: an active layer located between the base substrate and the second conductive layer, wherein the active layer includes a third active part, and the third active part is used to form a channel region of the driving transistor; a first conductive layer located between the active layer and the second conductive layer, wherein the first conductive layer includes a third conductive part, an orthographic projection of the third conductive part on the base substrate covers an orthographic projection of the third active part on the base substrate, and the third conductive part is used to form the gate of the driving transistor; and a third conductive layer located between the second conductive layer and the fourth conductive layer, wherein the third conductive layer includes a first bridging part, and the first bridging part is connected to the third conductive part and the first electrode of the second transistor through a via hole; wherein the second direction is a column direction, and in the same column of pixel driving circuits, an orthographic projection of the second power line on the base substrate extends along the second direction, an orthographic projection of the data line on the base substrate extends along the second direction, the orthographic projection of the second power line on the base substrate is located between the orthographic projection of the data line on the base substrate and an orthographic projection of the first bridging part on the base substrate, and the orthographic projection of the first power line on the base substrate is located on a side where the orthographic projection of the first bridging part on the base substrate is away from the orthographic projection of the second power line on the base substrate; and wherein in adjacent columns of pixel driving circuits, an orthographic projection of the first power line in a present column of pixel driving circuits on the base substrate is located between an orthographic projection of the data line in an adjacent column of pixel driving circuits on the base substrate and an orthographic projection of the first bridging part in the present column of pixel driving circuits on the base substrate.

In some embodiments of the present disclosure, the pixel driving circuit further includes a second transistor, a first electrode of the second transistor is connected to the gate of the driving transistor, and a second electrode of the second transistor is connected to a second electrode of the driving transistor. The display panel further includes: an active layer located between the base substrate and the second conductive layer, wherein the active layer includes a third active part, and the third active part is used to form a channel region of the driving transistor; a first conductive layer located between the active layer and the second conductive layer, wherein the first conductive layer includes a third conductive part, an orthographic projection of the third conductive part on the base substrate covers an orthographic projection of the third active part on the base substrate, and the third conductive part is used to form the gate of the driving transistor; and a third conductive layer located between the second conductive layer and the fourth conductive layer, wherein the third conductive layer includes a first bridging part, and the first bridging part is connected to the third conductive part and the first electrode of the second transistor through a via hole. The fourth conductive layer further includes: a fourth conductive part connected to the first power line, wherein an orthographic projection of the fourth conductive part on the base substrate at least partially overlaps with an orthographic projection of the first bridging part on the base substrate.

In some embodiments of the present disclosure, the pixel driving circuit further includes a first transistor and a seventh transistor, a first electrode of the first transistor is connected to a first initial signal line, a second electrode of the first transistor is connected to the gate of the driving transistor, a first electrode of the seventh transistor is connected to a second initial signal line, and a second electrode of the seventh transistor is connected to the first electrode of the light-emitting unit. The display panel further includes: an active layer located between the base substrate and the second conductive layer, wherein the active layer includes a first active part and a seventh active part, the first active part is used to form a channel region of the first transistor, and the seventh active part is used to form a channel region of the seventh transistor; and a first conductive layer located between the active layer and the second conductive layer, wherein the first conductive layer includes: a first reset signal line, wherein an orthographic projection of the first reset signal line on the base substrate extends along the first direction and covers an orthographic projection of the first active part on the base substrate, and a portion of a structure of the first reset signal line is used to form a gate of the first transistor; and a second reset signal line, wherein an orthographic projection of the second reset signal line on the base substrate extends along the first direction and covers an orthographic projection of the seventh active part on the base substrate, and a portion of a structure of the second reset signal line is used to form a gate of the seventh transistor; wherein the first direction is a row direction, and in adjacent rows of pixel driving circuits, the second reset signal line in a previous row of pixel driving circuits is shared as the first reset signal line in a present row of pixel driving circuits.

In some embodiments of the present disclosure, the active layer further includes a third active part used to form a channel region of the driving transistor The first conductive layer further includes a third conductive part, wherein an orthographic projection of the third conductive part on the base substrate covers an orthographic projection of the third active part on the base substrate, and the third conductive part is used to form the gate of the driving transistor. The second conductive layer further includes: a first initial signal line, wherein an orthographic projection of the first initial signal line on the base substrate extends along the first direction; and a second initial signal line, wherein an orthographic projection of the second initial signal line on the base substrate extends along the first direction; wherein in the same row of pixel driving circuits, the orthographic projection of the third conductive part on the base substrate is located between the orthographic projection of the first initial signal line on the base substrate and the orthographic projection of the second initial signal line on the base substrate, and the orthographic projection of the first initial signal line on the base substrate is located on a side where the orthographic projection of the first reset signal line on the base substrate is away from the orthographic projection of the third conductive part on the base substrate; and wherein in adjacent rows of pixel driving circuits, an orthographic projection of the second initial signal line in a previous row of pixel driving circuits on the base substrate is located between an orthographic projection of the first initial signal line in a present row of pixel driving circuits on the base substrate and an orthographic projection of the first reset signal line in the present row of pixel driving circuits on the base substrate.

In some embodiments of the present disclosure, the first active part includes a fourth sub active part and a fifth sub active part, and the active layer further includes a sixth sub active part connected between the fourth sub active part and the fifth sub active part; and wherein the orthographic projection of the second initial signal line in a previous row of pixel driving circuits on the base substrate at least partially overlaps with an orthographic projection of the sixth sub active part in a present row of pixel driving circuits on the base substrate.

In some embodiments of the present disclosure, the pixel driving circuit further includes a first transistor, a second transistor, a fourth transistor, a fifth transistor, a sixth transistor, and a seventh transistor; and wherein a first electrode of the first transistor is connected to a first initial signal line, and a second electrode of the first transistor is connected to the gate of the driving transistor; a first electrode of the second transistor is connected to the gate of the driving transistor, and a second electrode of the second transistor is connected to a second electrode of the driving transistor: a first electrode of the fourth transistor is connected to a data line, and a second electrode of the fourth transistor is connected to a first electrode of the driving transistor; a first electrode of the fifth transistor is connected to a second power line, and a second electrode of the fifth transistor is connected to the first electrode of the driving transistor; a first electrode of the sixth transistor is connected to the second electrode of the driving transistor, and a second electrode of the sixth transistor is connected to the first electrode of the light-emitting unit; a first electrode of the seventh transistor is connected to a second initial signal line, and a second electrode of the seventh transistor is connected to the first electrode of the light-emitting unit; and the first transistor, the second transistor, the driving transistor, the fourth transistor, the fifth transistor, the sixth transistor, and seventh transistor are all P-type transistors.

In some embodiments of the present disclosure, the display panel further includes an active layer located between the base substrate and the second conductive layer, wherein the active layer includes a third active part, a fourth active part, a fifth active part, a sixth active part, and a seventh active part, and wherein the third active part is used to form a channel region of the driving transistor, the fourth active part is used to form a channel region of the fourth transistor, the fifth active part is used to form a channel region of the fifth transistor, the sixth active part is used to form a channel region of the sixth transistor, and the seventh active part is used to form a channel region of the seventh transistor; and a first conductive layer located between the active layer and the second conductive layer, wherein the first conductive layer includes: a gate line, wherein an orthographic projection of the gate line on the base substrate extends along the first direction and covers an orthographic projection of the fourth active part on the base substrate, and a portion of a structure of the gate line is used to form a gate of the fourth transistor; an enabling signal line, wherein an orthographic projection of the enabling signal line on the base substrate extends along the first direction and covers an orthographic projection of the fifth active part on the base substrate and an orthographic projection of the sixth active part on the base substrate, a portion of a structure of the enabling signal line is used to form a gate of the fifth transistor, and the other portion of the structure of the enabling signal line is used to form a gate of the sixth transistor: a second reset signal line, wherein an orthographic projection of the second reset signal line on the base substrate extends along the first direction and covers an orthographic projection of the seventh active part on the base substrate, and a portion of a structure of the second reset signal line is used to form a gate of the seventh transistor; and a third conductive part, wherein an orthographic projection of the third conductive part on the base substrate covers an orthographic projection of the third active part on the base substrate, and the third conductive part is used to form the gate of the driving transistor; wherein in the same row of pixel driving circuits, the orthographic projection of the enabling signal line on the base substrate is located between the orthographic projection of the third conductive part on the base substrate and the orthographic projection of the second reset signal line on the base substrate.

According to one aspect of the present disclosure, a display device is provided, including a display panel as described above.

It should be understood that the general description above and the detailed description in the following are only illustrative and explanatory, and do not limit the present disclosure.

BRIEF DESCRIPTION OF THE DRAWINGS

The drawings herein, which are incorporated in and constitute a portion of this specification, illustrate embodiments consistent with the present disclosure and serve together with the specification to explain principles of the present disclosure. It is apparent that the drawings in the following description are only some embodiments of the present disclosure, and other drawings can be obtained based on the drawings by those of ordinary skill in the art without creative effort.

DETAILED DESCRIPTION

Figure 1:
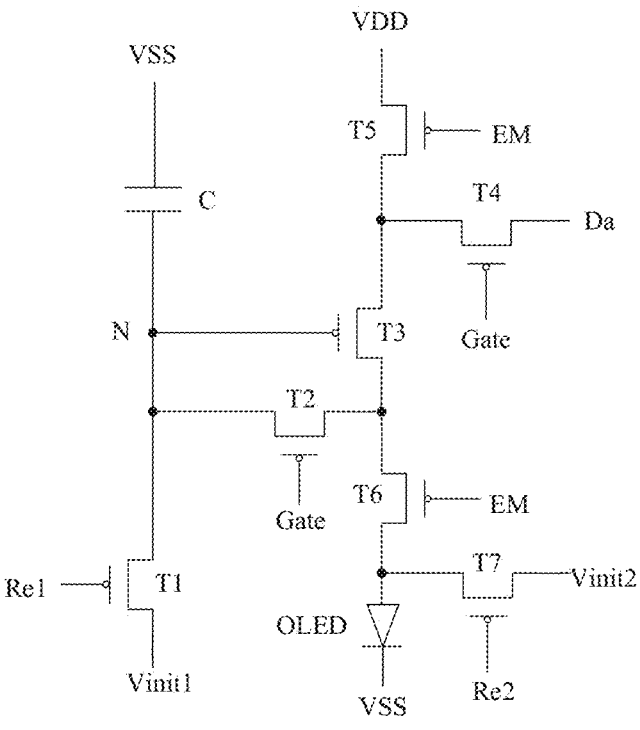
FIG. 1 is a schematic diagram of a circuit structure of a pixel driving circuit in a display panel according to exemplary embodiments of the present disclosure.

Example embodiments will now be described more fully with reference to the drawings. However, example embodiments can be implemented in a different ways and should not be construed as being limited to embodiments set forth herein. Rather, these embodiments are provided so as to make the present disclosure more comprehensive and complete, and to convey the ideas of example embodiments to those skilled in the art in a comprehensive manner. The same reference numerals in the drawings indicate the same or similar structures, and thus their detailed description will be omitted.

Terms "a", "an", or "the" are used to indicate the presence of one or more elements/components/etc. Terms "include" and "have" are used to indicate open inclusion and refer to the presence of additional elements/components/etc. in addition to the elements/components/etc. listed.

As shown in FIG. 1, a schematic diagram of a circuit structure of a pixel driving circuit in display panel according to exemplary embodiments of the present disclosure is provided. The pixel driving circuit can include a first transistor T1, a second transistor T2, a driving transistor T3, a fourth transistor T4, a fifth transistor T5, a sixth transistor T6, a seventh transistor T7, and a capacitor C. In some embodiments, a first electrode of the first transistor T1 is connected to a first initial signal terminal 'Vinit1', a second electrode of the first transistor T1 is connected to a node 'N', and a gate of the first transistor T1 is connected to a first reset signal terminal 'Re1'. A first electrode of the second transistor T2 is connected to a gate of the driving transistor T3, a second electrode of the second transistor T2 is connected to a second electrode of the driving transistor T3, and a gate of the second transistor T2 is connected to a gate driving signal terminal 'Gate', The gate of the driving transistor T3 is connected to the node 'N'. A first electrode of the fourth transistor T4 is connected to a data signal terminal 'Da', a second electrode of the fourth transistor T4 is connected to a first electrode of the driving transistor T3, and a gate of the fourth transistor T4 is connected to the gate driving signal terminal 'Gate', A first electrode of the fifth transistor T5 is connected to a second power supply terminal 'VDD', a second electrode of the fifth transistor T5 is connected to the first electrode of the driving transistor T3, and a gate of the fifth transistor T5 is connected to an enabling signal terminal 'EM' A first electrode of the sixth transistor T6 is connected to the second electrode of the driving transistor T3, and a gate of the sixth transistor T6 is connected to the enabling signal terminal 'EM'. A first electrode of the seventh transistor T7 is connected to a second initial signal terminal 'Vinit2' a second electrode of the seventh transistor T7 is connected to a second electrode of the sixth transistor T6, and a gate of the seventh transistor T7 is connected to a second reset signal terminal 'Re2'. A first electrode of the capacitor 'C' is connected to a first power supply terminal 'VSS', and a second electrode of the capacitor 'C' is connected to the gate of the driving transistor T3. The pixel driving circuit can be connected to a light-emitting unit OLED, and is used to drive the light-emitting unit OLED to emit light. A first electrode of the light-emitting unit OLED can be connected to the second electrode of the sixth transistor T6, and a second electrode of the light-emitting unit OLED can be connected to the first power supply terminal 'VSS'. In some embodiments, the first transistor T1, the second transistor T2, the driving transistor T3, the fourth transistor T4, the fifth transistor T5, the sixth transistor T6, and the seventh transistor T7 can all be P-type transistors.

Figure 2:
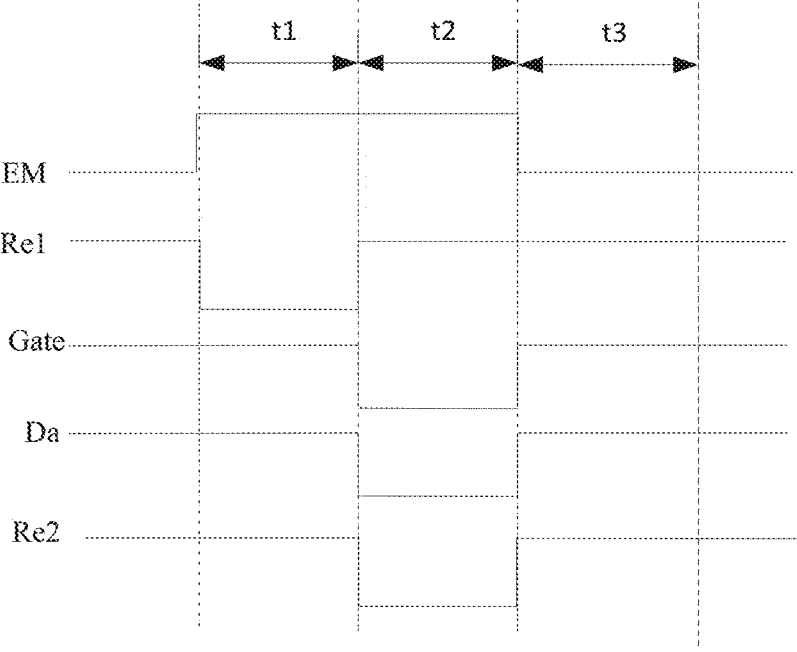
FIG. 2 is a timing diagram of each node in a driving method of the pixel driving circuit shown in FIG. 1.

As shown in FIG. 2, a timing diagram of each node signal in a driving method of the pixel driving circuit shown in FIG. 1 is provided. In some embodiments, 'Gate' represents a timing of a signal 'Gate' at a gate driving signal terminal, 'Re1' represents a timing of a signal 'Re1' at the first reset signal terminal, 'Re2' represents a timing of a signal 'Re2' at the second reset signal terminal, 'EM' represents a timing of a signal 'EM' at the enabling signal terminal, and 'Da' represents a timing of a signal 'Da' at the data signal terminal. A driving method of the pixel driving circuit can include a reset stage t1, a compensation stage t2, and a light emitting stage t3, In the reset stage t1, the first reset signal terminal 'Re1' outputs a low-level signal, the first transistor T1 is turned on, and the first initial signal terminal 'Vinit1' inputs a first initial signal to the node 'N'. In the compensation stage t2, the second reset signal terminal 'Re2' and the gate driving signal terminal 'Gate' output low-level signals, and the fourth transistor T4, the second transistor T2, and the seventh transistor T7 are turned on; at the same time, the data signal terminal 'Da' outputs a data signal to write a voltage 'Vdata+Vth' to the node 'N', where 'Vdata' is a voltage of the data signal and 'Vth' is a threshold voltage of the driving transistor T3; the second initial signal terminal 'Vinit2' inputs a second initial signal to the second electrode of the sixth transistor T6. In the light emitting stage t3, the enabling signal terminal 'EM' outputs a low-level signal, the sixth transistor T6 and the fifth transistor T5 are turned on, and the driving transistor T3 drives the light-emitting unit to emit light under the voltage 'Vdata+Vth' at the node 'N'. According to an output current formula of the driving transistor, $I=(\mu WCox/2 L)(Vgs-Vth)^2$, where $\mu$ is the carrier mobility, Cox is the gate capacitance per unit area. W is a width of a channel of the driving transistor, L is a length of the channel of the driving transistor channel, Vgs is the gate-source voltage difference of the driving transistor, and Vth is a threshold voltage of the driving transistor. An output current of the driving transistor in the pixel driving circuit of the present disclosure is $I=(\mu WCox/2 L)(Vdata+Vth-Vdd-Vth)^2$. The pixel driving circuit can avoid the impact of the threshold of the driving transistor on the output current of the driving transistor.

Figure 3:
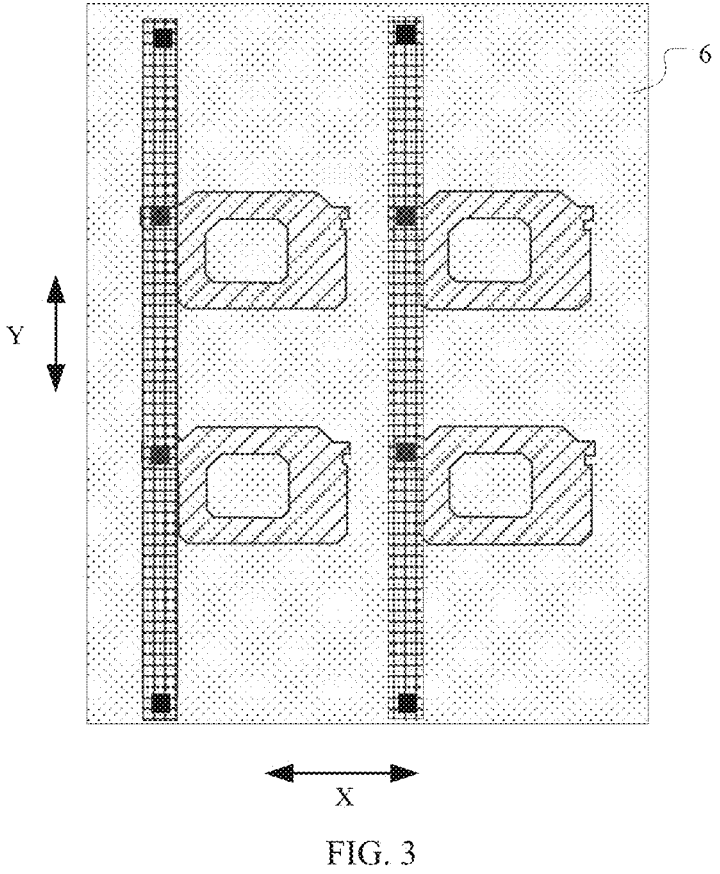
FIG. 3 is a structural layout of a display panel according to exemplary embodiments of the present disclosure.
Figure 4:
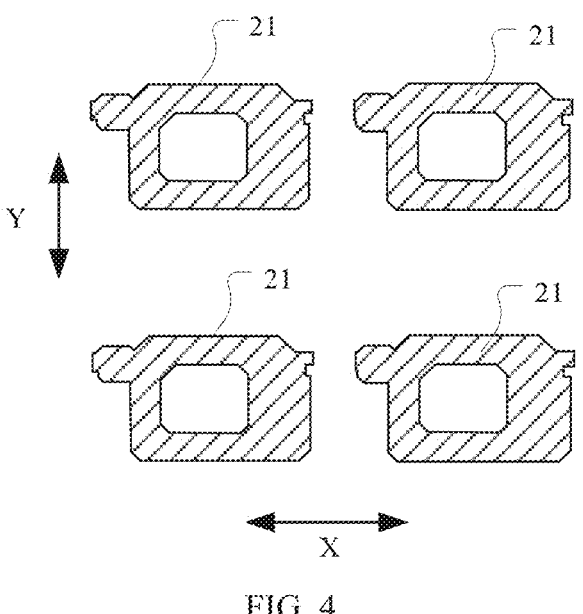
FIG. 4 is a structural layout of a second conductive layer in FIG. 3.
Figure 5:
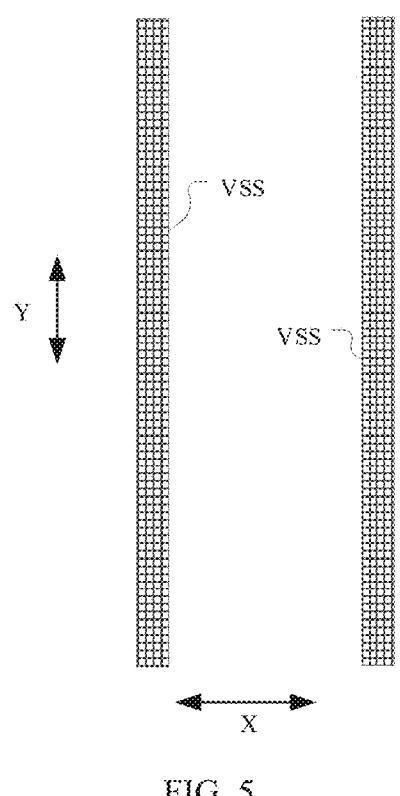
FIG. 5 is a structural layout of a fourth conductive layer in FIG. 3.
Figure 6:
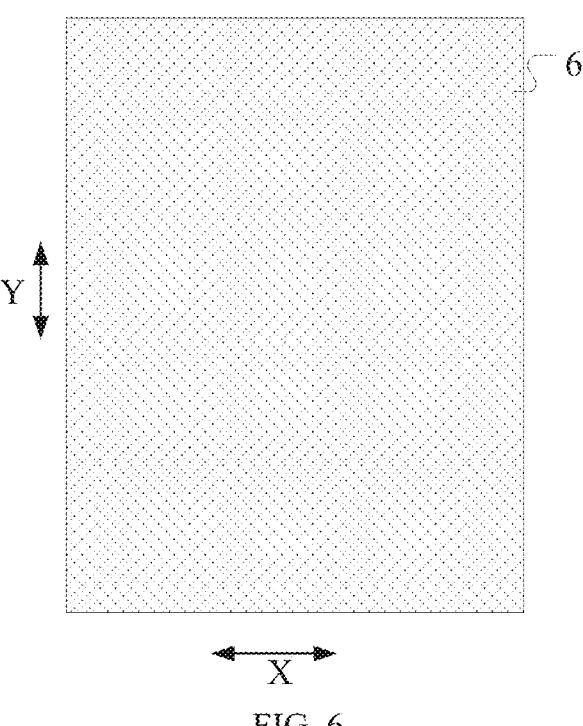
FIG. 6 is a structural layout of a common electrode in FIG. 3.
Figure 7:
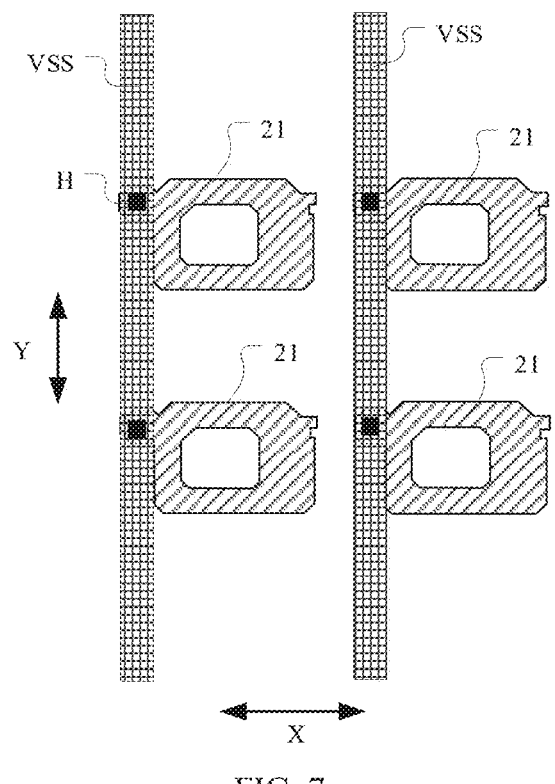
FIG. 7 is a structural layout of a second conductive layer and a fourth conductive layer in FIG. 3.

Exemplary embodiments of the present disclosure also provide a display panel. The display panel can include sub pixel units, and the sub pixel unit includes a pixel driving circuit and a light-emitting unit. The pixel driving circuit is connected to a first electrode of the light-emitting unit. The pixel driving circuit can be shown as FIG. 1. The display panel can further include a base substrate, a second conductive layer, a fourth conductive layer, and a common electrode layer arranged in stack, as shown in FIGS. 3-7. FIG. 3 is a structural layout of a display panel according to exemplary embodiments of the present disclosure, FIG. 4 is a structural layout of the second conductive layer in FIG. 3, FIG. 5 is a structural layout of the fourth conductive layer in FIG. 3, FIG. 6 is a structural layout of the common electrode in FIG. 3, and FIG. 7 is a structural layout of the second conductive layer and the fourth conductive layer in FIG. 3. In some embodiments, the display panel includes multiple sub pixel units arranged in an array along a first direction X and a second direction Y, and correspondingly, the display panel includes multiple pixel driving circuits arranged in an array along the first direction X and the second direction Y. In some embodiments, the first direction X intersects with the second direction Y, for example, the first direction X can be a row direction, and the second direction Y can be a column direction.

As shown in FIGS. 3, 4 and 7, the second conductive layer can include multiple first conductive parts 21, and the first conductive part 21 is arranged in correspondence with the pixel driving circuit. The first conductive part 21 can be used to form the first electrode of the capacitor 'C' in the pixel driving circuit corresponding thereto.

As shown in FIGS. 3, 5 and 7, the fourth conductive layer can include multiple first power lines 'VSS', and the first power line VSS' can provide the first power supply terminal 'VSS' in FIG. 1. An orthographic projection of the first power line 'VSS' on the base substrate can be distributed in a spaced manner along the first direction X and extend along the second direction Y. The first conductive part 21 can be connected to the first power line 'VSS' through a via hole 'H'. As shown, positions of the via holes are represented through black square blocks, and exemplary embodiments of the present disclosure only indicate the positions of some of the via holes. In some embodiments, an orthographic projection of a structure on the base substrate extending along a direction can be understood as that the orthographic projection of the structure on the base substrate extends along that direction in a straight line or in a bending line.

As shown in FIGS. 3 and 6, the common electrode layer 6 can be an integral structure, and the first power line 'VSS' can be connected to the common electrode layer 6 through a via hole in an edge wiring area of the display panel.

In some embodiments, at least a portion of a structure of the first power line 'VSS' is located in a display area of the display panel. The first power line 'VSS' can reduce a voltage drop caused by the resistance of the common electrode layer 6, thereby reducing the power consumption of the display panel while the first power supply terminal 'VSS' and the second power supply terminal 'VDD' ensure that the driving transistor is operated in the saturation region, as shown in FIG. 1. In addition, in the display panel, the first electrode (the first conductive part 21) of the capacitor 'C' is connected to the first power line 'VSS', thereby reducing a resistance of the first power line 'VSS' itself and further reducing the voltage drop caused by the resistance of the common electrode layer 6.

Figure 8:
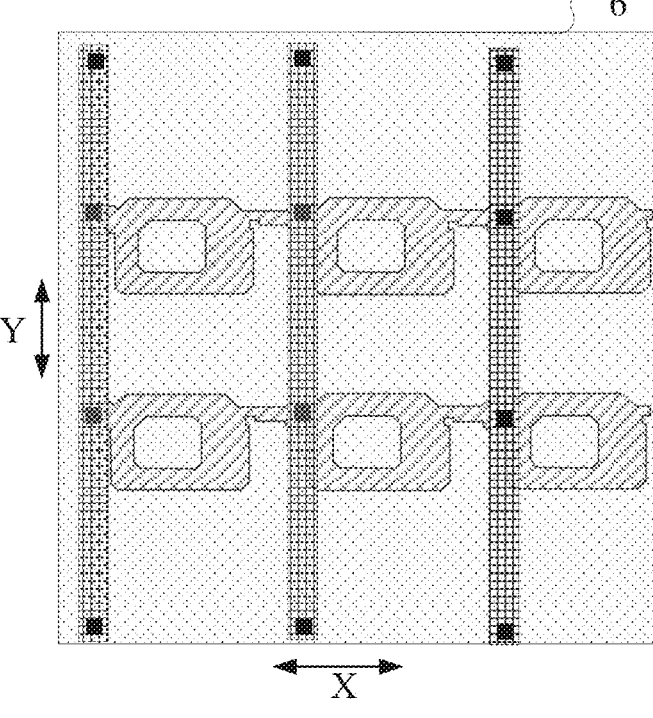
FIG. 8 is a structural layout of a display panel according to exemplary embodiments of the present disclosure.
Figure 9:
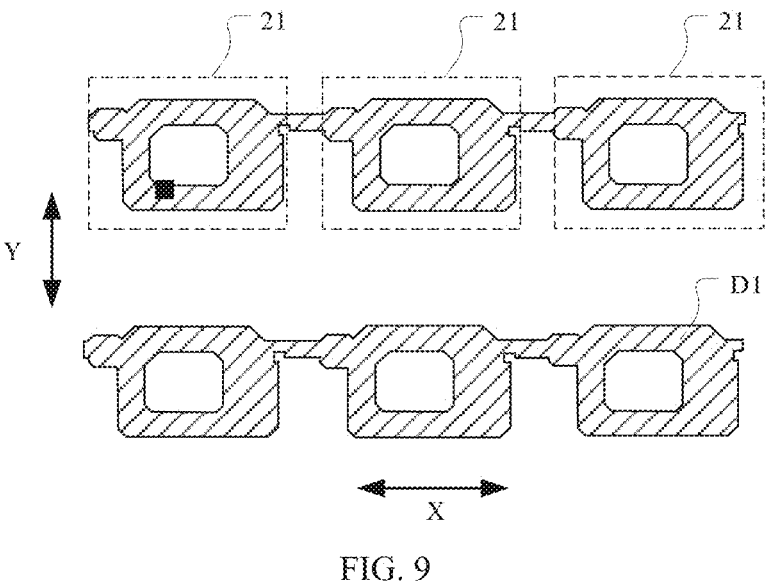
FIG. 9 is a structural layout of a second conductive layer in FIG. 8.
Figure 10:
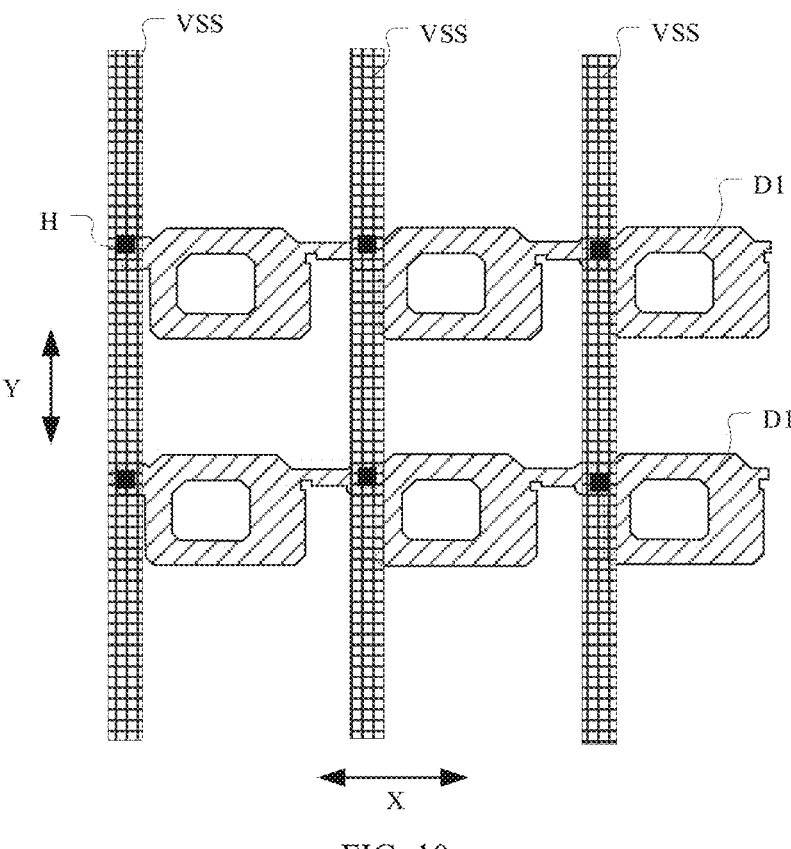
FIG. 10 is a structural layout of a second conductive layer and a fourth conductive layer in FIG. 8.

In some embodiments, as shown in FIGS. 8-10, FIG. 8 is a structural layout of a display panel according to exemplary embodiments of the present disclosure, FIG. 9 is a structural layout of a second conductive layer in FIG. 8, and FIG. 10 is a structural layout of the second conductive layer and a fourth conductive layer in FIG. 8.

In some embodiments, the display panel shown in FIG. 8 differs from the display panel shown in FIG. 3 in that all the first conductive parts 21 arranged along the first direction X are sequentially connected to form a first conductive line D1, and the first conductive line D1 is connected to each of the first power lines 'VSS'. Such arrangements can enable the first power line 'VSS' and the first conductive line D1 to form a grid structure, thereby further reducing the voltage drop caused by the resistance of the common electrode layer 6.

Figure 11:
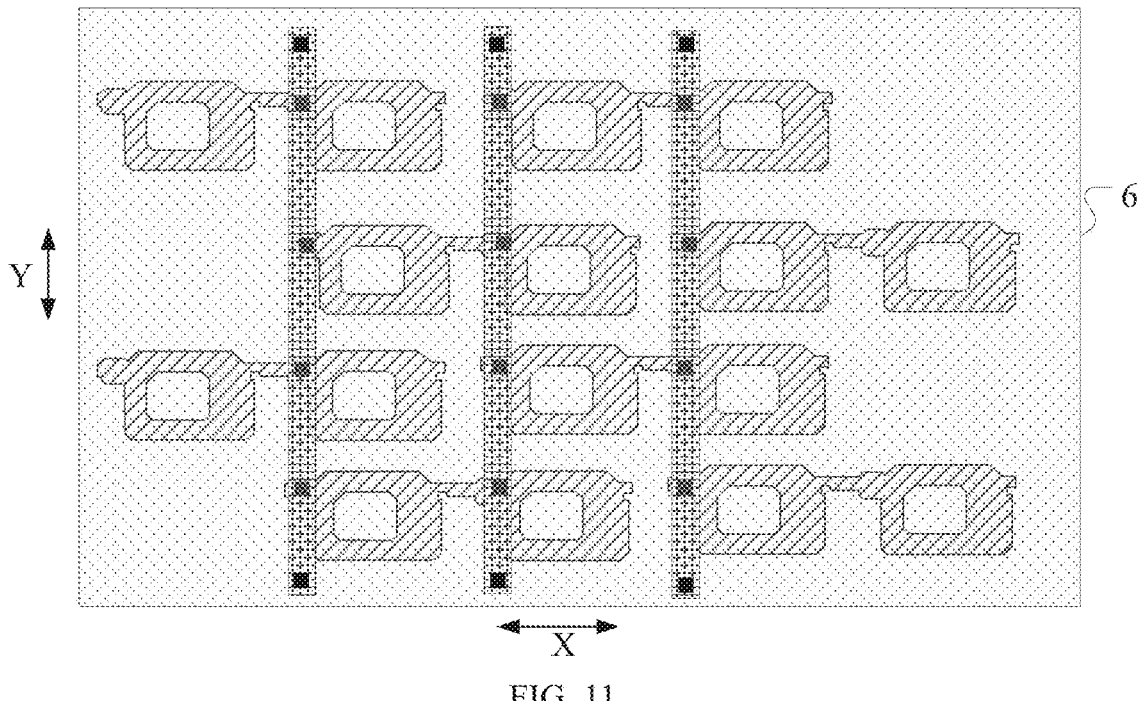
FIG. 11 is a structural layout of a display panel according to exemplary embodiments of the present disclosure.
Figure 12:
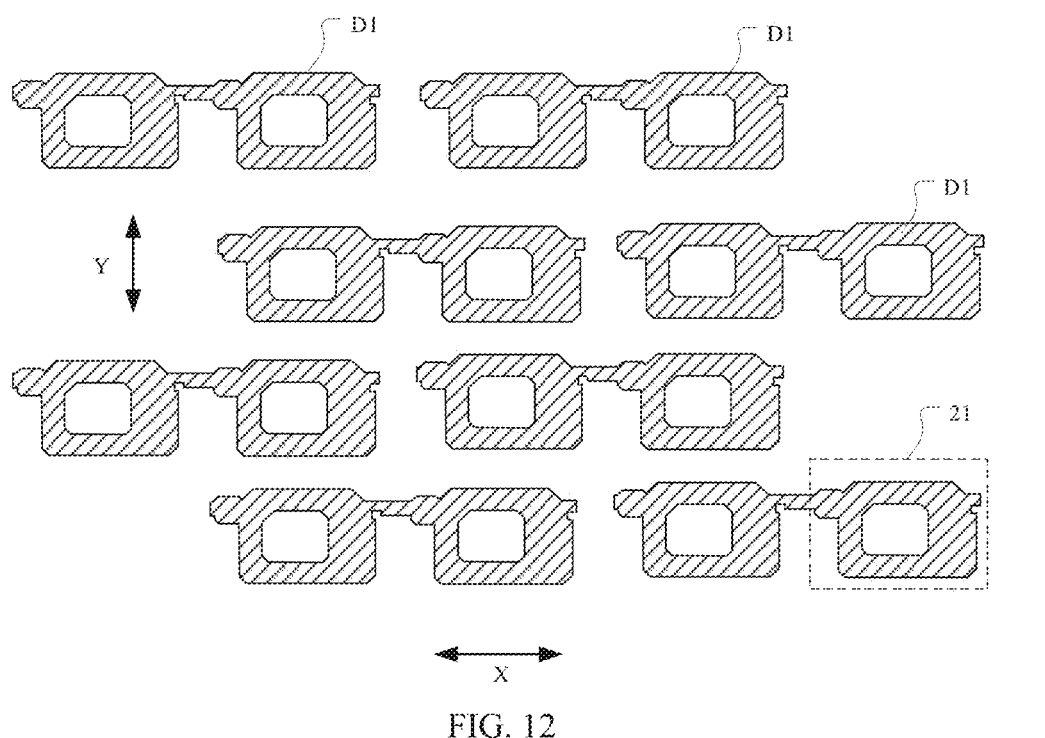
FIG. 12 is a structural layout of a second conductive layer in FIG. 11.
Figure 13:
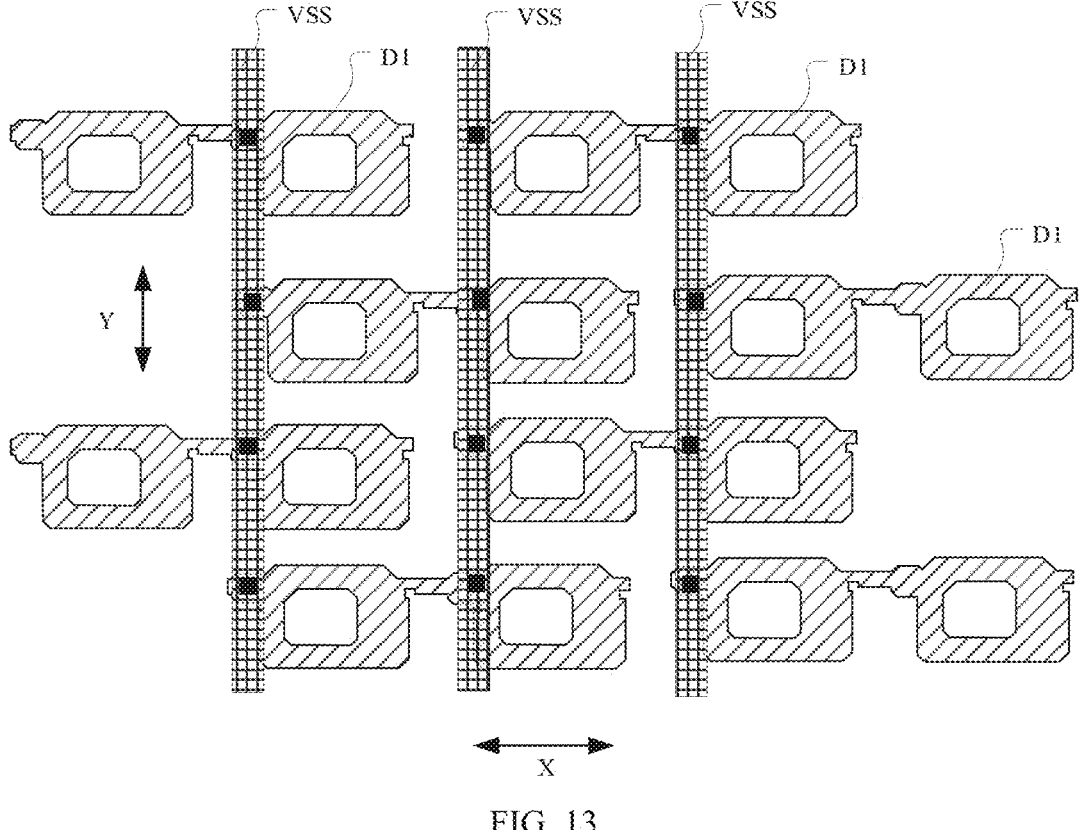
FIG. 13 is a structural layout of a second conductive layer and a fourth conductive layer in FIG. 11.

It should be understood that in some other embodiments, the first conductive parts 21 arranged along the first direction X can also be only partially sequentially connected to form the first conductive line, and the first conductive line can be connected to multiple first power lines. For example, as shown in FIGS. 11-13, FIG. 1 is a structural layout of a display panel according to exemplary embodiments of the present disclosure, FIG. 12 is a structural layout of a second conductive layer in FIG. 11, and FIG. 13 is a structural layout of the second conductive layer and a fourth conductive layer in FIG. 11. In some embodiments, multiple first conductive parts 21 arranged along the first direction X can form multiple first conductive lines D1 distributed in a spaced manner along the first direction X. Two first conductive lines D1 adjacent in both the first direction X and the second direction Y can be distributed in an interlaced manner along the first direction X. That is, areas covered by infinite movements along the second direction Y of orthographic projections on the base substrate of the two first conductive lines D1 adjacent in both the first direction X and the second direction Y partially intersect. The first conductive line D1 can be connected to two first power lines 'VSS'. Such arrangement can also enable the first power line 'VSS' and the first conductive line D1 to form a grid structure between.

It should be understood that in some other embodiments, the pixel driving circuit in the display panel can also be of other structures, as long as the first electrode of the capacitor 'C' in the pixel driving circuit and the common electrode of the light-emitting unit are connected to the same signal terminal, the display panel can reduce the voltage drop caused by the resistance of the common electrode through above schemes. For example, in the pixel driving circuit shown in FIG. 1, the first transistor T1 and the second transistor T2 can also be N-type transistors, which can reduce leakage currents of the first transistor T1 and the second transistor T2 through the node 'N'.

Figure 14:
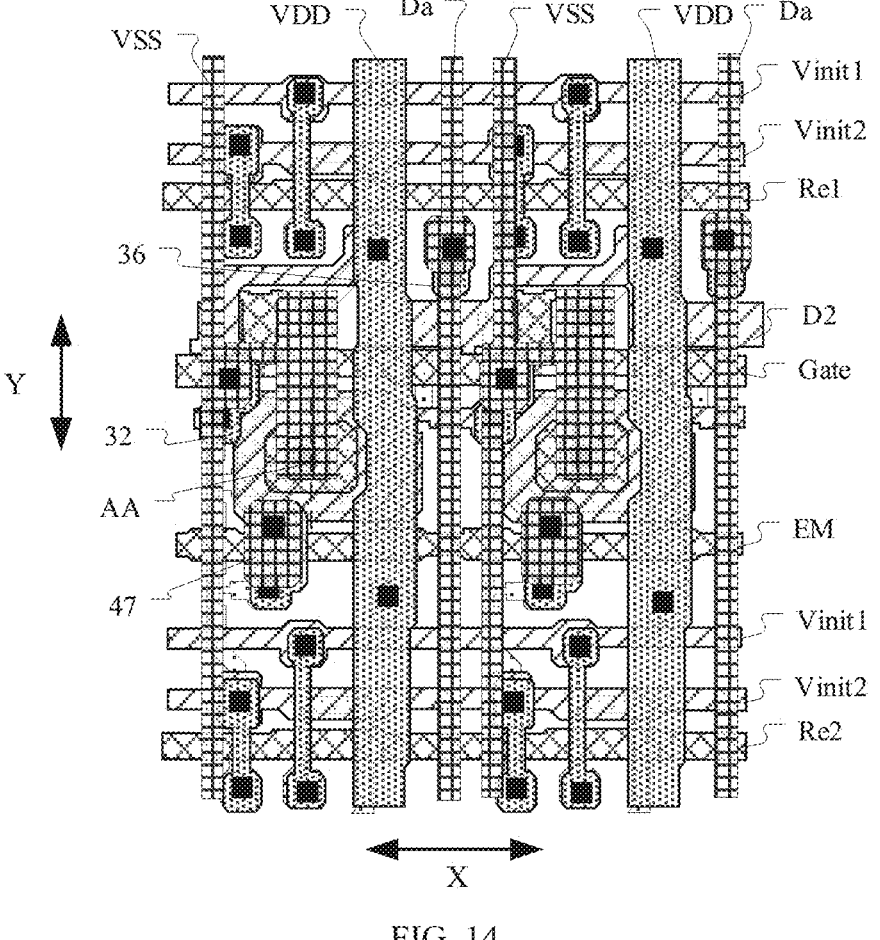
FIG. 14 is a structural layout of a display panel according to exemplary embodiments of the present disclosure.
Figure 15:
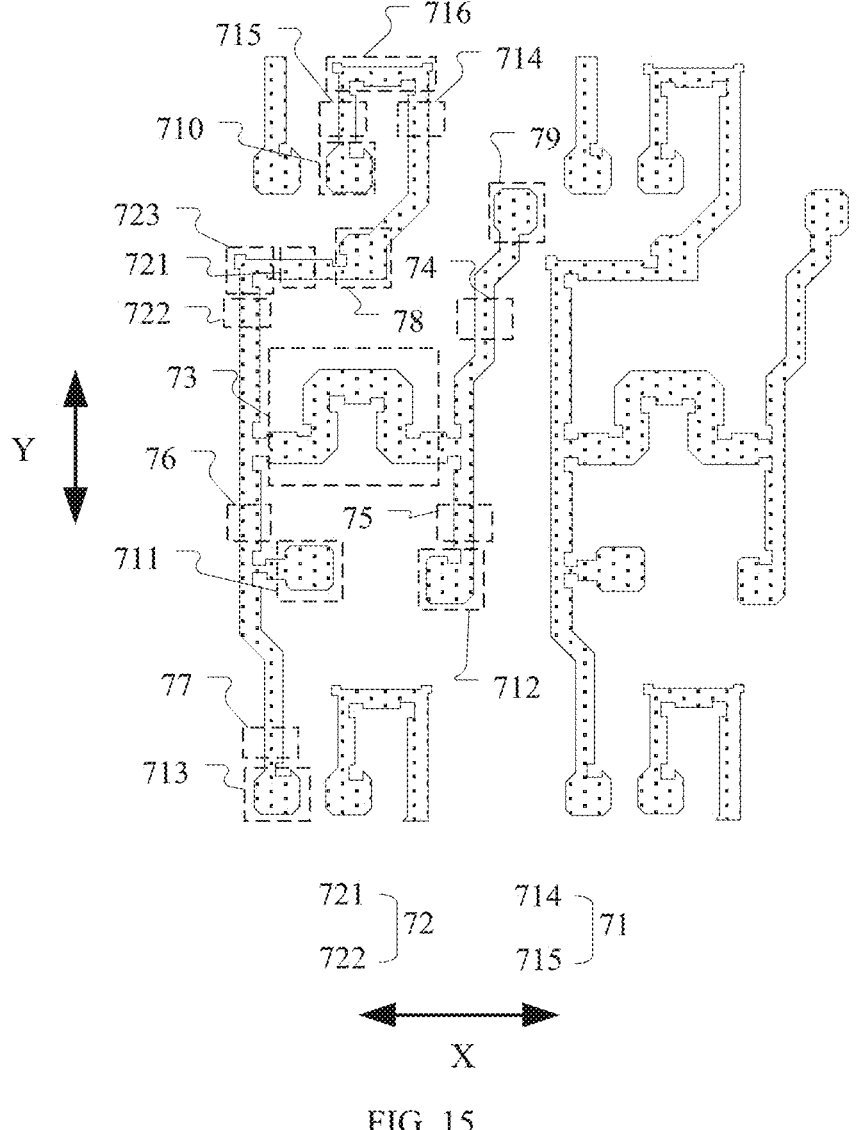
FIG. 15 is a structural layout of an active layer in FIG. 14.
Figure 16:
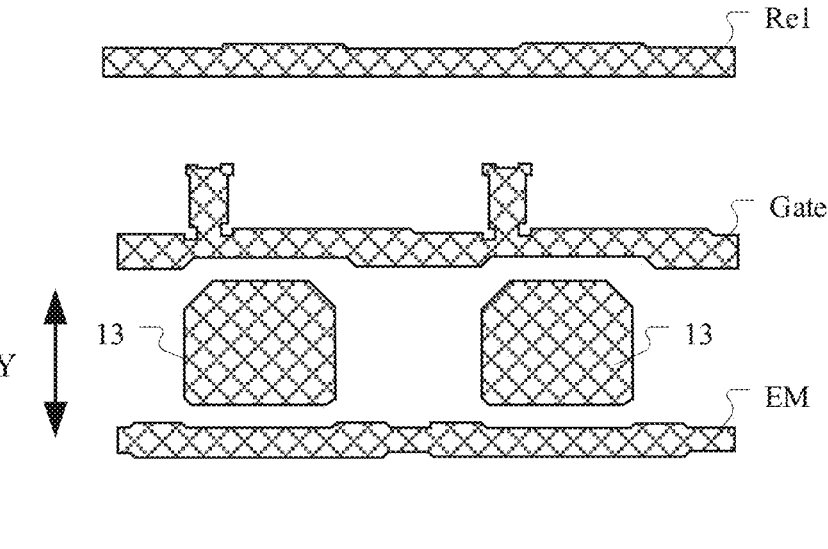
FIG. 16 is a structural layout of a first conductive layer in FIG. 14.
Figure 17:
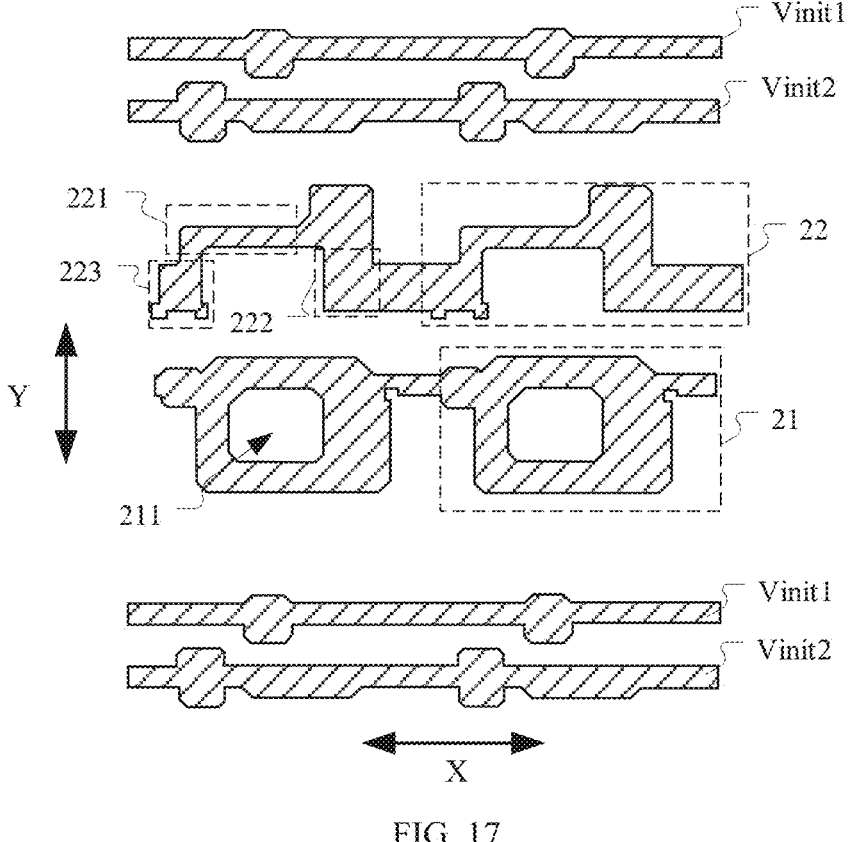
FIG. 17 is a structural layout of a second conductive layer in FIG. 14.
Figure 18:
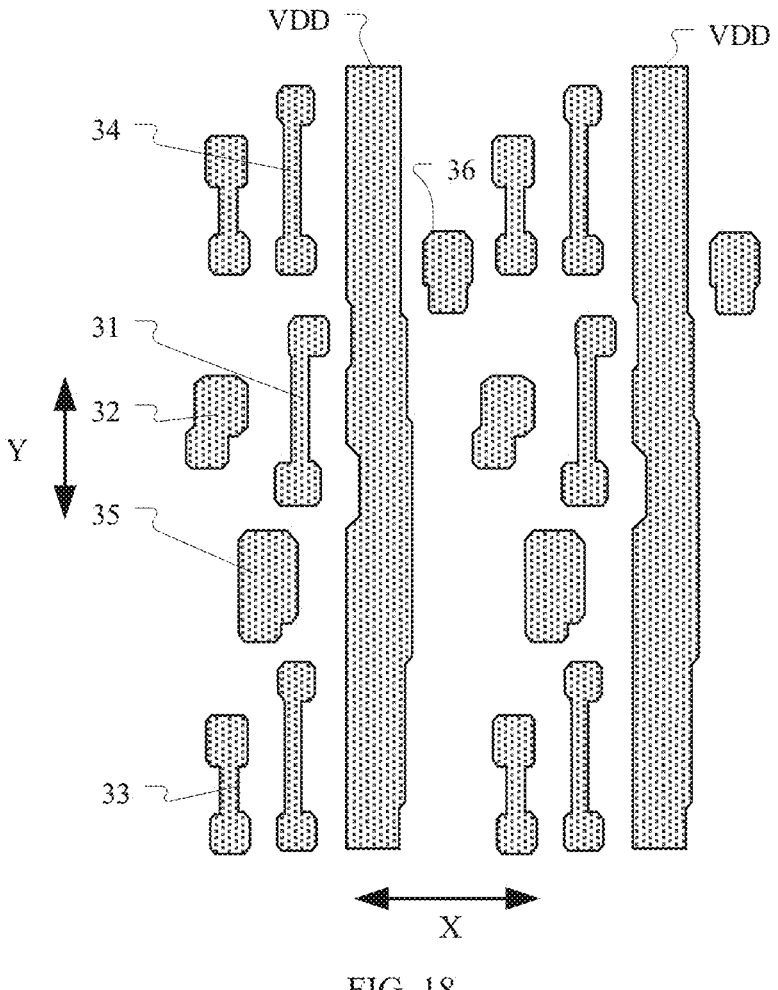
FIG. 18 is a structural layout of a third conductive layer in FIG. 14.
Figure 19:
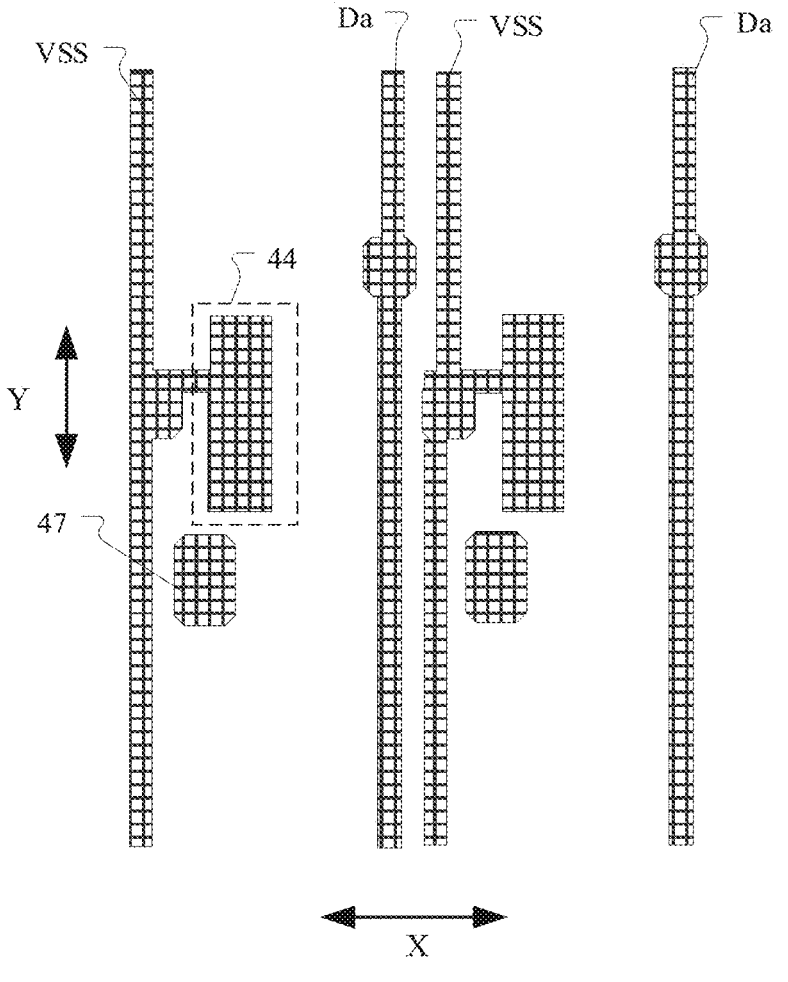
FIG. 19 is a structural lay out of a fourth conductive layer in FIG. 14.
Figure 20:
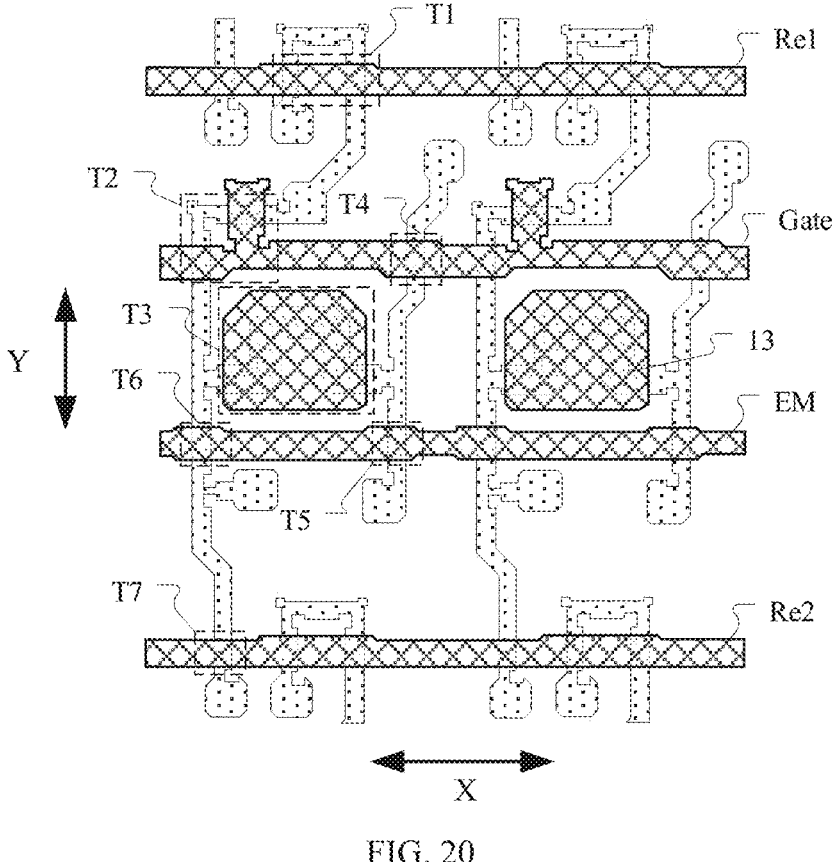
FIG. 20 is a structural layout of an active layer and a first conductive layer in FIG. 14.
Figure 21:
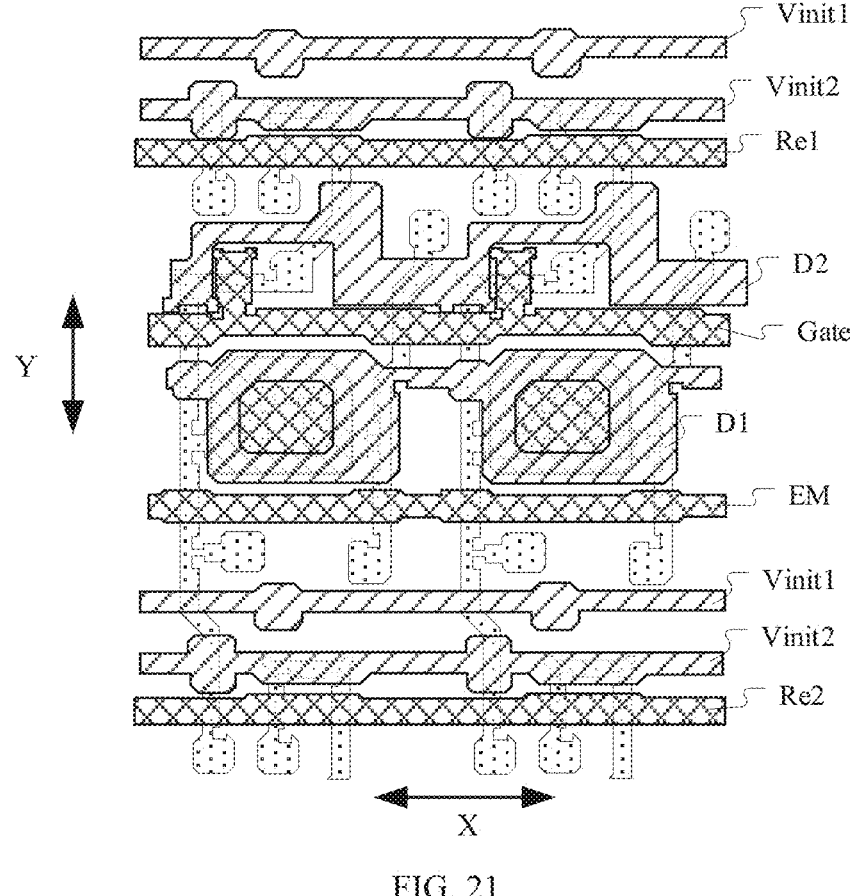
FIG. 21 is a structural layout of an active layer, a first conductive layer, and a second conductive layer in FIG. 14.
Figures 22, 23:
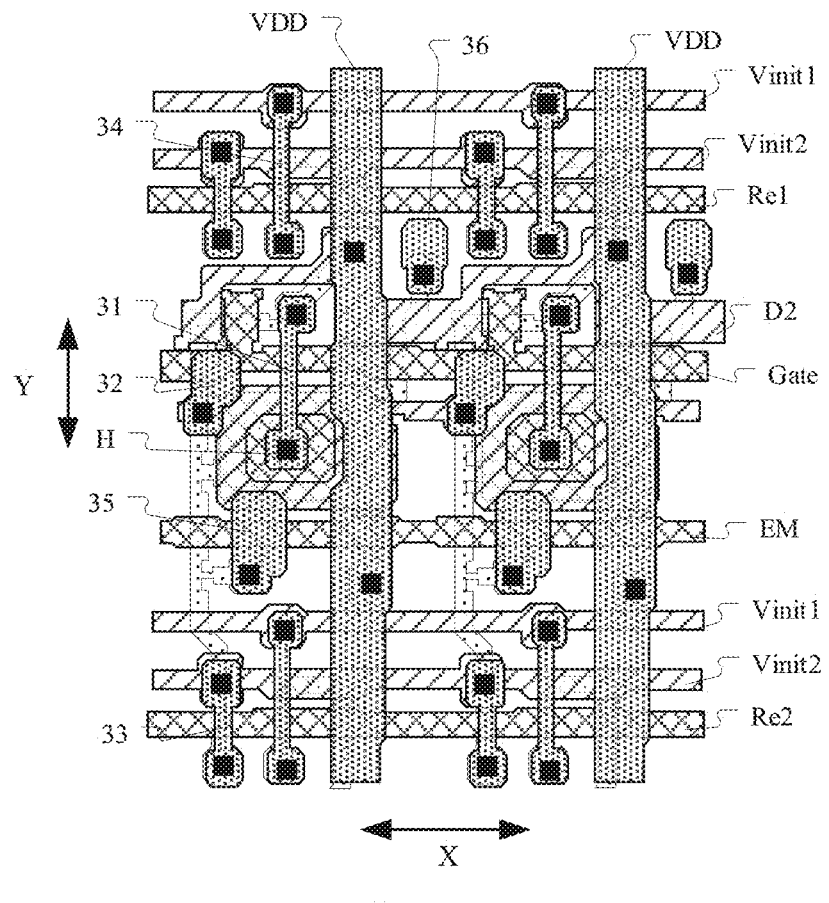
FIG. 22 is a structural layout of an active layer, a first conductive laver, a second conductive layer, and a third conductive layer in FIG. 14.
FIG. 23 is a cross-sectional view of the display panel along a dashed line AA as shown in FIG. 14.

In some embodiments, the display panel can further include an active layer, a first conductive layer, and a third conductive layer. In some embodiments, the base substrate, the active layer, the first conductive layer, the second conductive layer, the third conductive layer, the fourth conductive layer, and the common electrode are sequentially arranged in stack, and an insulation layer can further be arranged between above structural layers. As shown in FIGS. 14-22, FIG. 14 is a structural layout of a display panel according to exemplary embodiments of the present disclosure, FIG. 15 is a structural layout of the active layer in FIG. 14, FIG. 16 is a structural layout of the first conductive layer in FIG. 14, FIG. 17 is a structural layout of the second conductive layer in FIG. 14, FIG. 18 is a structural layout of the third conductive layer in FIG. 14, FIG. 19 is a structural layout of the fourth conductive layer in FIG. 14, FIG. 20 is a structural layout of the active layer and the first conductive layer in FIG. 14, FIG. 21 is a structural layout of the active layer, the first conductive layer, and the second conductive layer in FIG. 14, and FIG. 22 is a structural layout of the active layer, the first conductive layer, the second conductive layer, and the third conductive layer in FIG. 14.

As shown in FIGS. 14, 15 and 20, the active layer can include a first active part 71, a second active part 72, a third active part 73, a fourth active part 74, a fifth active part 75, a sixth active part 76, and a seventh active part 77. In some embodiments, the first active part 71 is used to form a channel region of the first transistor T1, the second active part 72 is used to form a channel region of the second transistor T2, the third active part 73 is used to form a channel region of the driving transistor T3, the fourth active part 74 is used to form a channel region of the fourth transistor T4, the fifth active pail 75 is used to form a channel region of the fifth transistor T5, the sixth active part 76 is used to form a channel region of the sixth transistor T6, and the seventh active part 77 is used to form a channel region of the seventh transistor T7. In some embodiments, the first active part 71 includes a fourth sub active part 714 and a fifth sub active part 715, and the second active part 72 includes a first sub active part 721 and a second sub active part 722. The active layer can further include a sixth sub active part 716 connected between the fourth sub active part 714 and the fifth sub active part 715, a third sub active part 723 connected between the first sub active part 721 and the second sub active part 722, an eighth active part 78 connected between the second active part 72 and the first active part 71, a ninth active part 79 connected to a side of the fourth active part 74 away from the third active part 73, a tenth active part 710 connected to a side of the first active part 71 away from the second active part 72, an eleventh active part 711 connected between the sixth active part 76 and the seventh active part 77, a twelfth active part 712 connected to a side of the fifth active part 75 away from the third active part 73 and a thirteenth active part 713 connected to a side of the seventh active part 77 away from the sixth active part 76. The first active layer can be formed from polycrystalline silicon materials. In some embodiments, the first transistor T1, the second transistor T2, the driving transistor T3, the fourth transistor T4, the fifth transistor T5, the sixth transistor T6, and the seventh transistor T7 can be P-type Low-temperature polycrystalline silicon thin film transistors.

As shown in FIGS. 14, 16 and 20, the first conductive layer can include a first reset signal line 'Re1', a second reset signal line 'Re2', a gate line 'Gate', an enabling signal line 'EM', and a third conductive part 13. In some embodiments, the first reset signal line 'Re1' is used to provide the first reset signal terminal in FIG. 1, the second reset signal line 'Re2' is used to provide the second reset signal terminal in FIG. 1, the gate line 'Gate' is used to provide the gate driving signal terminal in FIG. 1, and the enabling signal line 'EM' is used to provide the enabling signal terminal in FIG. 1. An orthographic projection of the first reset signal line 'Re1' on the base substrate can extend along the first direction X and cover an orthographic projection of the first active part 71 on the base substrate. A portion of a structure of the first reset signal line 'Re1' is used to form the gate of the first transistor T1. An orthographic projection of the second reset signal line 'Re2' on the base substrate can extend along the first direction X and cover an orthographic projection of the seventh active part 77 on the base substrate. A portion of a structure of the second reset signal line 'Re2' is used to form the gate of the seventh transistor T7. An orthographic projection of the enabling signal line 'EM' on the base substrate can extend along the first direction X and cover an orthographic projection of the fifth active part 75 on the base substrate, and an orthographic projection of the sixth active part 76 on the base substrate. A portion of a structure of the enabling signal line 'EM' is used to form the gate of the fifth transistor T5, and the other part of the structure of the enabling signal line 'EM' is used to form the gate of the sixth transistor T6. An orthographic projection of the gate line 'Gate' on the base substrate extends along the first direction X and covers an orthographic projection of the second active part 72 on the base substrate, and an orthographic projection of the fourth active part 74 on the base substrate. A portion of a structure of the gate line 'Gate' is used to form the gate of the second transistor T2, and the other part of the gate line 'Gate' is used to form the gate of the fourth transistor T4. An orthographic projection of the third conductive part 13 on the base substrate covers an orthographic projection of the third active part 73 on the base substrate, and the third conductive part 13 is used to form the gate of the driving transistor T3. The third conductive part 13 can also be shared as the second electrode of the capacitor 'C'. An orthographic projection of the third conductive part 13 on the base substrate can be located between the orthographic projection of the gate line 'Gate' on the base substrate and the orthographic projection of the enabling signal line 'EM' on the base substrate. The orthographic projection of the first reset signal line 'Re1' on the base substrate can be located on a side where the orthographic projection of the gate line 'Gate' on the base substrate is away from the orthographic projection of the third conductive part 13 on the base substrate. The orthographic projection of the second reset signal line 'Re2' on the base substrate can be located on a side where the orthographic projection of the enabling signal line 'EM' on the base substrate is away from the orthographic projection of the third conductive part 13 on the base substrate. In adjacent rows of pixel driving circuits, a second reset signal line 'Re2' in the previous row of the pixel driving circuit can be shared as a first reset signal line 'Re1' in the present row, of the pixel driving circuit, Such arrangements can reduce a size of the pixel driving circuit in the second direction. In some embodiments, the display panel can use the first conductive layer as a mask to perform conductorization treatment on the active layer That is, a region in the active layer covered by the first conductive layer can form a channel region of the transistor, and a region in the active layer not covered by the first conductive layer forms a conductor structure.

As shown in FIGS. 14, 17 and 21, the second conductive layer can include a first initial signal line 'Vinit1', a second initial signal line 'Vinit2', a first conductive part 21, and a second conductive part 22. The first initial signal line 'Vinit1' can be used to provide the first initial signal terminal in FIG. 1, and the second initial signal line 'Vinit2' can be used to provide the second initial signal terminal in FIG. 1. Both an orthographic projection of the first initial signal line 'Vinit1' on the base substrate and an orthographic projection of the second initial signal line 'Vinit2' on the base substrate can extend along the first direction X. An orthographic projection of the first conductive part 21 on the base substrate can at least partially overlap with an orthographic projection of the third conductive part 13 on the base substrate. The first conductive part 21 can be used to form the first electrode of the capacitor 'C'. In some embodiments, multiple first conductive parts 21 arranged along the first direction X can be sequentially connected to form a first conductive line D1. Multiple second conductive parts 22 arranged along the first direction X can be sequentially connected to form a second conductive line D2. In the same row of the pixel driving circuit, orthographic projections of the second conductive parts 22 on the base substrate can be located between the orthographic projection of the first reset signal line 'Re1' on the base substrate and the orthographic projection of the gate line 'Gate' on the base substrate. In the same row of the pixel driving circuit, the orthographic projection of the third conductive part 13 on the base substrate can be located between the orthographic projection of the first initial signal line 'Vinit1' on the base substrate and the orthographic projection of the second initial signal line 'Vinit2' on the base substrate, and the orthographic projection of the first initial signal line 'Vinit1' on the base substrate is located on a side where the orthographic projection of the first reset signal line 'Re1' on the base substrate is away from the orthographic projection of the third conductive part 13 on the base substrate. In adjacent rows of pixel driving circuits, an orthographic projection of a second initial signal line 'Vinit2' in the previous row of the pixel driving circuit on the base substrate can be located between an orthographic projection of a first initial signal line 'Vinit1' in the present row of the pixel driving circuit on the base substrate and an orthographic projection of a first reset signal line 'Re1' in the present row of the pixel driving circuit on the base substrate. Such arrangements can further reduce a size of the pixel driving circuit in the second direction. As shown in FIGS. 14, 17 and 21, the second conductive part 22 can include a third sub conductive part 223, and an orthographic projection of the third sub conductive part 223 on the base substrate at least partially overlaps with an orthographic projection of the third sub active part 723 on the base substrate. The second conductive part 22 can be connected to a stable voltage supply, and the third sub conductive part 223 can play a voltage stabilizing role on the third sub active part 723, which can improve a leakage to the source and the drain of the second transistor T2 caused by a voltage change in the third sub active part 723. An orthographic projection of a second initial signal line 'Vinit2' in the previous row of the pixel driving circuit on the base substrate can at least partially overlap with an orthographic projection of the sixth sub active part 716 in the present row of the pixel driving circuit on the base substrate. The second initial signal line 'Vinit2' can play a voltage stabilizing role on the sixth sub active part 716, which can improve a leakage to the source and the drain of the first transistor T1 caused by a voltage change in the sixth sub active part 716.

As shown in FIGS. 14, 18 and 22, the third conductive layer can include a second power line 'VDD', a first bridging part 31, a second bridging part 32, a third bridging part 33, a fourth bridging part 34, a fifth bridging part 35, and a sixth bridging part 36. In some embodiments, the second power line 'VDD' can be used to provide the second power supply terminal in the pixel driving circuit shown in FIG. 1. An orthographic projection of the second power line 'VDD' on the base substrate can extend along the second direction, and the second power line 'VDD' can be connected to the second conductive part 22 through a via hole, to provide a stable voltage supply to the second conductive part 22. It should be understood that in other exemplary embodiments, the stable voltage supply can also be provided to the second conductive part 22 through other signal lines, for example, the first power line 'VSS' the first initial signal line 'Vinit1', and the second initial signal line 'Vinit2' can provide the stable voltage supply to the second conductive part 22. The second power line 'VDD' and the second conductive line D2 can also form a grid structure, thereby reducing the voltage drop caused by the resistance of the second power line 'VDD' itself. The second power line 'VDD' can also be connected to the twelfth active part 712 through a via hole, to connect the first electrode of the fifth transistor T5 and the second power supply terminal. The first bridging part 31 can be connected to the third conductive part 13 and the eighth active part 78 through via holes 'H', respectively, to connect the gate of the driving transistor T3, the second electrode of the first transistor T1, and the first electrode of the second transistor T2. As shown in FIG. 17, the first conductive part 21 can be provided with an opening 211 thereon, and an orthographic projection of a via hole connected to the first bridging part 31 and the third conductive part 13 on the base substrate can be located within an orthographic projection of the opening 211 on the base substrate, so as to avoid a connection between the conductive structure in the via hole and the first conductive part 21. The second bridging part 32 can be connected to the first conductive part 21 through a via hole to connect the first electrode of the capacitor. The third bridging part 33 can be connected to the thirteenth active part 713 and the second initial signal line 'Vinit2' through via holes, respectively, to connect the first electrode of the seventh transistor and the second initial signal terminal. The fourth bridging part 34 can be connected to the tenth active part 710 and the first initial signal line 'Vinit1' through via holes, respectively, to connect the first electrode of the first transistor T1 and the first initial signal terminal. The fifth bridging part 35 can be connected to the eleventh active part 711 through a via hole, to connect the second electrode of the sixth transistor T6 and the second electrode of the seventh transistor T7. The sixth bridging part 36 can be connected to the ninth active part 79 through a via hole to connect the first electrode of the fourth transistor T4 As shown in FIGS. 14, 17, 18 and 22, the second conductive part 22 can further include a first sub conductive part 221. The first sub conductive part 221 is connected to the third sub conductive part 223. An orthographic projection of the first sub conductive part 221 on the base substrate can extend along the first direction X, and is located between the orthographic projection of the first bridging part 31 on the base substrate and the orthographic projection of the first reset signal line 'Re1' on the base substrate. That is, an area covered by an infinite movement along the second direction Y of the orthographic projection of the first sub conductive part 221 on the base substrate at least partially intersects with an area covered by an infinite movement along the second direction Y of the orthographic projection of the first bridging part 31 on the base substrate. The first sub conductive part 221 can shield the noise impact of the first reset signal line 'Re1' on the first bridging part 31, thus improving the voltage stability of the node 'N' in the pixel driving circuit shown in FIG. 1. In some embodiments, an area covered by an infinite movement along the second direction Y of the orthographic projection of the first sub conductive part 221 on the base substrate covers an area covered by an infinite movement along the second direction Y of the orthographic projection of the first bridging part 31 on the base substrate.

As shown in FIGS. 14 and 19, the fourth conductive layer can include a first power line 'VSS', a data line 'Da', and a seventh bridging part 47. In sore embodiments, the first power line 'VSS' is used to provide the first power supply terminal in the pixel driving circuit shown in FIG. 1, and the data line 'Da' is used to provide the data signal terminal in the pixel driving circuit shown in FIG. 1. An orthographic projection of the first power line 'VSS' on the base substrate and an orthographic projection of the data line 'Da' on the base substrate can extend along the second direction Y. Each column of the pixel driving circuit can be arranged in correspondence with one first power line 'VSS' and one data line 'Da'. It should be understood that, in other embodiments, multiple columns of pixel driving circuits can also be arranged in correspondence with one first power line 'VSS'. The first power line 'VSS' can be connected to the second bridging part 32 through a via hole to connect the first power supply terminal and the first electrode of the capacitor 'C'. The data line 'Da' can be connected to the sixth bridging part 36 through a via hole to connect the first electrode of the fourth transistor T4 and the data signal terminal. As shown in FIGS. 14 and 19, the fourth conductive layer can further include a fourth conductive part 44, and the fourth conductive part 44 is connected to the first power line 'VSS'. An orthographic projection of the fourth conductive part 44 on the base substrate can at least partially overlap with an orthographic projection of the first bridging part 31 on the base substrate. The fourth conductive part 44 can shield the noise impact of other signal lines on the first bridging part 31. In some embodiments, the orthographic projection of the fourth conductive part 44 on the base substrate can cover the orthographic projection of the first bridging part 31 on the base substrate. As shown in FIG. 14, an orthographic projection of the second power line 'VDD' on the base substrate can be located between an orthographic projection of the data line 'Da' on the base substrate and an orthographic projection of the first bridging part 31 on the base substrate. An orthographic projection of the first power line 'VSS' on the base substrate can be located on a side where the orthographic projection of the first bridging part 31 on the base substrate is away from the orthographic projection of the second power line 'VDD' on the base substrate. An orthographic projection of the first power line 'VSS' in the present column of the pixel driving circuit on the base substrate is located between an orthographic projection of the data line 'Da' in an adjacent column of the pixel driving circuit on the base substrate and an orthographic projection of the first bridging part 31 in the present column of the pixel driving circuit on the base substrate. The second power line 'VDD' can shield the noise impact of the data line 'Da' in the present column of the pixel driving circuit on the first bridging part 31 in the present column of the pixel driving circuit, and the first power line 'VSS' can shield the noise impact of the data line 'Da' in the adjacent column of the pixel driving circuit on the first bridging part 31 in the present column of the pixel driving circuit. The orthographic projection of the first power line 'VSS' on the base substrate can also at least partially overlap with the orthographic projection of the sixth active part 76 on the base substrate. In some embodiments, the first power line 'VSS' can provide a low-level power supply signal, and the first power line 'VSS' can improve a response speed of the sixth transistor T6. The first power line 'VSS' can also be connected to the common electrode layer through a via hole.

As shown in FIGS. 14, 17, 18 and 22, the second conductive part 22 can further include a second sub conductive part 222, and the second sub conductive part 222 is connected to a side of the first sub conductive part 221 away from the third sub conductive part 223. An orthographic projection of the second sub conductive part 222 on the base substrate can extend along the second direction Y, and is located between the orthographic projection of the first bridging part 31 on the base substrate and the orthographic projection of the data line 'Da' on the base substrate. That is, an area covered by an infinite movement along the first direction X of the orthographic projection of the second sub conductive part 222 on the base substrate at least partially intersects with an area covered by an infinite movement along the first direction X of the orthographic projection of the first bridging part 31 on the base substrate. The second sub conductive part 222 can shield the noise impact of the data line 'Da' on the first bridging part 31.

It should be noted that, as shown in FIGS. 14 and 22, a black square block drawn on a side of the third conductive layer away from the base substrate represents the via hole through which the third conductive layer is connected to other layers on a side facing the base substrate. A black square block drawn on a side of the fourth conductive layer away from the base substrate represents the via hole through which the fourth conductive layer is connected to other layers on a side facing the base substrate. The black square blocks only represent positions of the via holes, and different black square blocks at different positions represent that different via holes can penetrate different insulation layers.

As shown in FIG. 23, it is a cross-sectional view of the display panel along a dashed line AA as shown in FIG. 14. The display panel can further include a buffer layer 82, a first insulation layer 83, a second insulation layer 84, a first dielectric layer 85, a passivation layer 86, and a second dielectric layer 87. In some embodiments, the base substrate 81, the buffer layer 82, the active layer, the first insulation layer 83, the first conductive layer, the second insulation layer 84, the second conductive layer, the first dielectric layer 85, the third conductive layer, the passivation layer 86, the second dielectric layer 87, and the fourth conductive layer are sequentially arranged in stack. The first insulation layer 83 and the second insulation layer 84 can be silicon oxide layers. The first dielectric layer 85 and the second dielectric layer 87 can be silicon nitride layers. The materials of the passivation layer 86 and the buffer layer 82 can be silicon oxide, silicon nitride, etc. The base substrate 81 can include a glass substrate, a barrier layer and a polyimide layer arranged in stack in sequence. The barrier layer can be an inorganic material. The materials of the first conductive layer and the second conductive layer can be one of molybdenum, aluminum, copper, titanium, niobium or alloys, or molybdenum/titanium alloys or laminations. The materials of the third conductive layer and the fourth conductive layer can include metal materials, such as one of molybdenum, aluminum, copper, titanium, niobium or alloys, or molybdenum/titanium alloys or laminations, or titanium/aluminum/titanium laminations.

Figure 24:
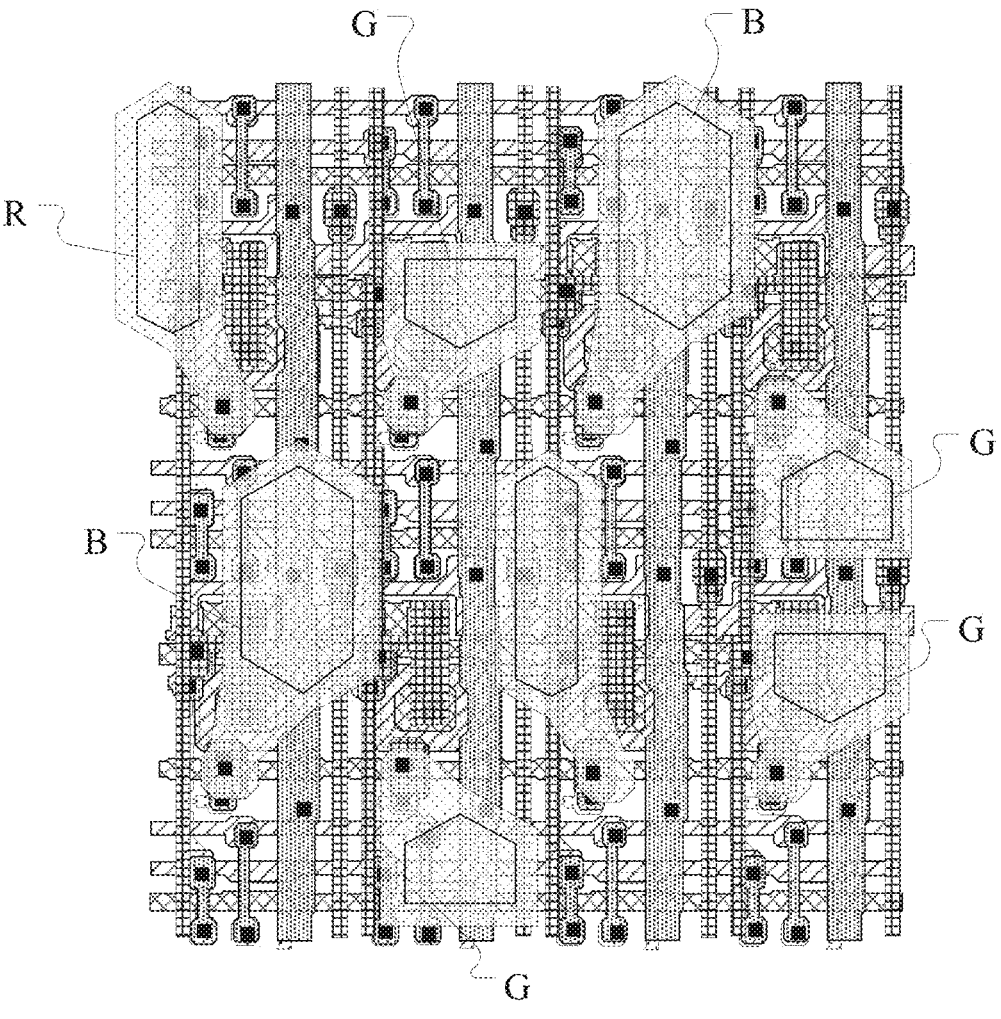
FIG. 24 is a structural layout of a display panel according to exemplary embodiments of the present disclosure.
Figure 25:
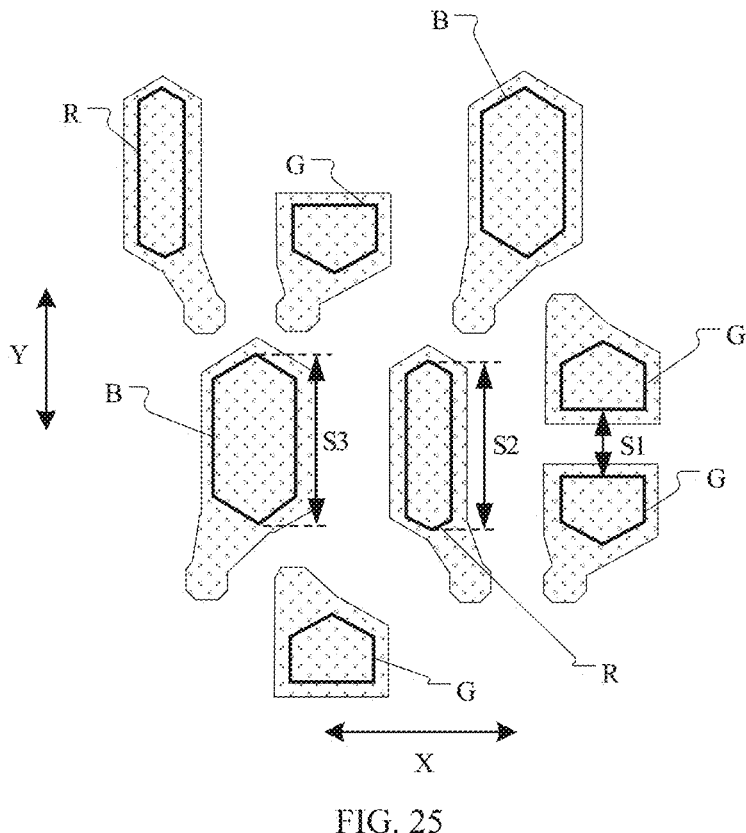
FIG. 25 is a structural layout of a pixel electrode layer in FIG. 24.

The display panel can further include a pixel electrode layer located between the fourth conductive layer and the common electrode layer. As shown in FIGS. 24 and 25, FIG. 24 is a structural layout of a display panel according to exemplary embodiments of the present disclosure, and FIG. 25 is a structural layout of the pixel electrode layer in FIG. 24. The pixel electrode layer can include multiple electrode parts, which can be used to form the first electrode of the light-emitting unit. The multiple electrode parts include multiple R electrode parts 'R', multiple G electrode parts 'G', and multiple B electrode parts 'B', Among the multiple electrode parts connected to the same row of pixel driving circuits, the R electrode part, the G electrode part, the B electrode part, and the G electrode part are alternately arranged in sequence along the row direction. In adjacent two columns of pixel driving circuits, multiple R electrode parts and multiple B electrode parts are connected to the same column of pixel driving circuits, and the R electrode parts and the B electrode parts connected to the same column of pixel driving circuits are alternately arranged in sequence along the column direction, and the multiple G electrode parts are connected to the other column of pixel driving circuits. A minimum distance S1 in the column direction of orthographic projections on the base substrate of two G electrode parts connected to adjacent rows of pixel driving circuits and connected to the same column of pixel driving circuits, is less than a size S2 in the column direction of an orthographic projection of the R electrode part on the base substrate or a size S3 in the column direction of an orthographic projection of the B electrode part on the base substrate. In some embodiments, the display panel can further include a pixel definition layer located on a side of the electrode layer away from the base substrate. The orthographic projection of the R electrode part on the base substrate coincides with an orthographic projection of an opening corresponding thereto on the pixel definition layer on the base substrate, the orthographic projection of the C electrode part on the base substrate coincides with an orthographic projection of an opening corresponding thereto on the pixel definition layer on the base substrate, and the orthographic projection of the B electrode part on the base substrate coincides with an orthographic projection of an opening corresponding thereto on the pixel definition layer on the base substrate. Each electrode part can be connected to the seventh bridging part 47 through a via hole to connect the second electrode of the sixth transistor T6.

As shown in FIGS. 24 and 25, the R electrode part 'R' and the B electrode part 'B' are hexagonal, and the G electrode part 'G' is pentagonal. It should be understood that, in some other embodiments, corners of the R electrode part 'R', B electrode part 'B' and G electrode part 'G' can also be arc-shaped. Such arrangements can improve the color deviation of the display panel.

Figure 26:
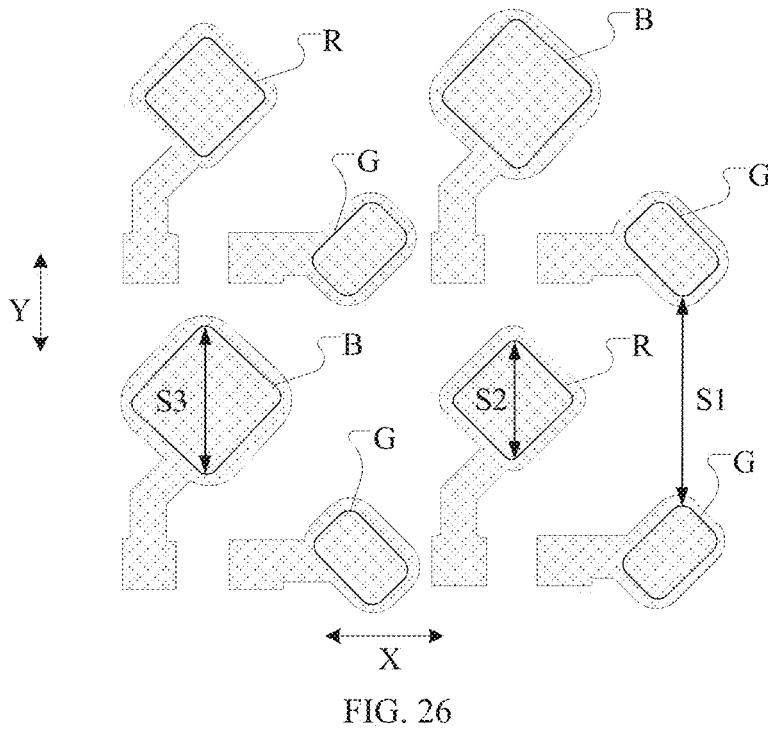
FIG. 26 is a structural layout of a pixel electrode layer in a display panel according to exemplary embodiments of the present disclosure.

In some other embodiments, the electrode parts may have other structures and arrangements. For example, as shown in FIG. 26, it is a structural layout of a pixel electrode layer in a display panel according to exemplary embodiments of the present disclosure. The pixel electrode layer can include multiple electrode parts, namely the R electrode part 'R', the G electrode part 'G', and the B electrode part 'B'. Each electrode part can be connected to the seventh bridging part 47 through a via hole to connect the second electrode of the sixth transistor. Among multiple electrode parts connected to the same row of pixel driving circuits, the R electrode part, the G electrode part, the B electrode part, and the G electrode part are alternately arranged in sequence along the row direction. In adjacent two columns of pixel driving circuits, multiple R electrode parts and multiple B electrode parts are connected to the same column of pixel driving circuits, and the R electrode parts and the B electrode parts connected to the same column of pixel driving circuits are alternately arranged in sequence along the column direction, while multiple G electrode parts are connected to the other column of pixel driving circuits. A minimum distance S1 in the column direction of orthographic projections on the base substrate of two G electrode parts connected to adjacent rows of pixel driving circuits and connected to the same column of pixel driving circuits, is greater than the size S2 in the column direction of the orthographic projection of the R electrode part on the base substrate or the size S3 in the column direction of the orthographic projection of the B electrode part on the base substrate. In some embodiments, the orthographic projection of the R electrode part on the base substrate coincides with the orthographic projection of the opening corresponding thereto on the pixel definition layer on the base substrate, the orthographic projection of the G electrode part on the base substrate coincides with the orthographic projection of the opening corresponding thereto on the pixel definition layer on the base substrate, and the orthographic projection of the B electrode part on the base substrate coincides with the orthographic projection of the opening corresponding thereto on the pixel definition layer on the base substrate.

It should be noted that a proportion in the drawings of the present disclosure can be used as a reference in an actual process, but is not limited to this. For example, a width-length ratio of the channel, a thickness and a spacing of each film layer, and a width and a spacing of each signal line can be adjusted according to actual needs. The number of pixels in the display substrate and the number of sub pixels per pixel are not limited to the number shown in the figure. The drawings described in the present disclosure are only schematic structural diagrams. In addition, 'first', 'second' and other determiners are only used to define different structural names, and they have no specific meanings indicating an order.

Embodiments of the present disclosure also provide a display device, which includes the display panel mentioned above. The display device can be a mobile phone, a tablet, a TV, or other display devices.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, the true scope and spirit of the disclosure being indicated by the appended claims.

It should be understood that the present disclosure is not limited to the precise structure described above and shown in the drawings, and various modifications and changes can be made without departing from the scope of the present disclosure, which is limited only by the appended claims.

What is claimed is:

1. A display panel, comprising sub pixel units arranged in an array along a first direction and a second direction intersecting with the first direction, wherein each of the sub pixel units comprises a pixel driving circuit and a light-emitting unit, the pixel driving circuit is connected to a first electrode of the light-emitting unit, the pixel driving circuit comprises a driving transistor and a capacitor, a first electrode of the capacitor is connected to one of multiple first power lines, and a second electrode of the capacitor is connected to a gate of the driving transistor, and wherein the display panel further comprises:

a base substrate;

a second conductive layer located on a side of the base substrate, wherein the second conductive layer comprises multiple first conductive parts, each of the multiple first conductive parts is arranged in correspondence with the pixel driving circuit, and the first conductive part is used to form the first electrode of the capacitor in the pixel driving circuit corresponding thereto;

a fourth conductive layer located on a side of the second conductive layer away from the base substrate, wherein the fourth conductive layer comprises the multiple first power lines, orthographic projections of the first power lines on the base substrate are distributed in a spaced manner along the first direction and extend along the second direction, and the first conductive part is connected to the first power line through a first via hole; and a common electrode layer located on a side of the fourth conductive layer away from the base substrate, wherein the common electrode layer is used to form a second electrode of the light-emitting unit, and the first power line is connected to the common electrode layer through a second via hole;

wherein at least a portion of the first conductive parts arranged along the first direction are connected in sequence to form at least one first conductive line, and the first conductive line is connected to the multiple first power lines.

2. The display panel according to claim 1, wherein all of the first conductive parts arranged along the first direction are connected in sequence to form the first conductive line, and the first conductive line is connected to each of the first power lines.

3. The display panel according to claim 1, wherein multiple of the first conductive parts arranged along the first direction form multiple first conductive lines distributed in a spaced manner along the first direction, and wherein two first conductive lines adjacent in both the first direction and the second direction are distributed in an interlaced manner along the first direction, and the two first conductive lines distributed in an interlaced manner are jointly connected to at least two of the first power lines.

4. The display panel according to claim 1, wherein the pixel driving circuit further comprises a sixth transistor, a first electrode of the sixth transistor is connected to a second electrode of the driving transistor, a second electrode of the sixth transistor is connected to the first electrode of the light-emitting unit, and the sixth transistor is a P-type transistor, and wherein the first power line is used to provide a low-level power supply signal; and wherein the display panel further comprises:

an active layer located between the base substrate and the second conductive layer, wherein the active layer comprises a sixth active part, and the sixth active part is used to form a channel region of the sixth transistor, and wherein the orthographic projections of the first power lines on the base substrate at least partially overlap with an orthographic projection of the sixth active part on the base substrate.

5. The display panel according to claim 1, wherein the pixel driving circuit further comprises a second transistor, a first electrode of the second transistor is connected to the gate of the driving transistor, and a second electrode of the second transistor is connected to a second electrode of the driving transistor; and wherein the second conductive layer further comprises at least one second conductive part connected to a stable power supply terminal; and wherein the display panel further comprises:

an active layer located between the base substrate and the second conductive layer, wherein the active layer comprises a second active part and a third sub active part, and the second active part comprises a first sub active part and a second sub active part, and wherein the third sub active part is connected between the first sub active part and the second sub active part, the first sub active part is used to form a first channel region of the second transistor, and the second sub active part is used to form a second channel region of the second transistor, and wherein an orthographic projection of the second conductive part on the base substrate at least partially overlaps with an orthographic projection of the third sub active part on the base substrate.

6. The display panel according to claim 5, wherein a first electrode of the driving transistor is connected to one of multiple second power lines, and the second conductive part is connected to the second power line through a third via hole; and wherein the second conductive layer comprises multiple second conductive parts, each of the second conductive parts is arranged in correspondence with the pixel driving circuit, and at least a portion of the second conductive parts arranged along the first direction are connected in sequence to form a second conductive line; and wherein the display panel further comprises the multiple second power lines, orthographic projections of the multiple second power lines on the base substrate are distributed in a spaced manner along the first direction and extend along the second direction, and the second conductive line is connected to the multiple second power lines.

7. The display panel according to claim 5, wherein the pixel driving circuit further comprises a first transistor, a first electrode of the first transistor is connected to a first initial signal line, and a second electrode of the first transistor is connected to the gate of the driving transistor; and wherein the active layer further comprises a first active part and a third active part, the first active part is used to form a channel region of the first transistor, and the third active part is used to form a channel region of the driving transistor; and wherein the display panel further comprises:

a first conductive layer located between the active layer and the second conductive layer, wherein the first conductive layer comprises:

a first reset signal line, wherein an orthographic projection of the first reset signal line on the base substrate extends along the first direction and covers an orthographic projection of the first active part on the base substrate, and a portion of a structure of the first reset signal line is used to form a gate of the first transistor;

a gate line, wherein an orthographic projection of the gate line on the base substrate extends along the first direction and covers an orthographic projection of the second active part on the base substrate, and a portion of a structure of the gate line is used to form a gate of the second transistor; and a third conductive part, wherein an orthographic projection of the third conductive part on the base substrate covers an orthographic projection of the third active part on the base substrate, and the third conductive part is used to form the gate of the driving transistor;

wherein the orthographic projection of the first reset signal line on the base substrate is located on a side where the orthographic projection of the gate line on the base substrate is away from the orthographic projection of the third conductive part on the base substrate, and the orthographic projection of the second conductive part on the base substrate is located between the orthographic projection of the first reset signal line on the base substrate and the orthographic projection of the gate line on the base substrate.

8. The display panel according to claim 7, further comprising:

a third conductive layer located between the second conductive layer and the fourth conductive layer, wherein the third conductive layer comprises a first bridging part, and the first bridging part is connected to the third conductive part and the first electrode of the second transistor through a fourth via hole; and wherein the second conductive part comprises:

a first sub conductive part, wherein an orthographic projection of the first sub conductive part on the base substrate extends along the first direction, and is located between an orthographic projection of the first bridging part on the base substrate and the orthographic projection of the first reset signal line on the base substrate.

9. The display panel according to claim 8, further comprising:

a data line, wherein an orthographic projection of the data line on the base substrate extends along the second direction; and wherein the second conductive part further comprises:

a second sub conductive part connected to the first sub conductive part, wherein an orthographic projection of the second sub conductive part on the base substrate extends along the second direction, and is located between the orthographic projection of the first bridging part on the base substrate and the orthographic projection of the data line on the base substrate.

10. The display panel according to claim 1, wherein the driving transistor is connected to a second power line, and the pixel driving circuit further comprises a second transistor and a fourth transistor, and wherein a first electrode of the second transistor is connected to the gate of the driving transistor, a second electrode of the second transistor is connected to a second electrode of the driving transistor, a first electrode of the fourth transistor is connected to a data line, and a second electrode of the fourth transistor is connected to a first electrode of the driving transistor; and wherein the display panel further comprises:

an active layer located between the base substrate and the second conductive layer, wherein the active layer comprises a third active part, and the third active part is used to form a channel region of the driving transistor;

a first conductive layer located between the active layer and the second conductive layer, wherein the first conductive layer comprises a third conductive part, an orthographic projection of the third conductive part on the base substrate covers an orthographic projection of the third active part on the base substrate, and the third conductive part is used to form the gate of the driving transistor; and a third conductive layer located between the second conductive layer and the fourth conductive layer, wherein the third conductive layer comprises a first bridging part, and the first bridging part is connected to the third conductive part and the first electrode of the second transistor through a fourth via hole;

wherein the second direction is a column direction, and in the same column of pixel driving circuits, an orthographic projection of the second power line on the base substrate extends along the second direction, an orthographic projection of the data line on the base substrate extends along the second direction, the orthographic projection of the second power line on the base substrate is located between the orthographic projection of the data line on the base substrate and an orthographic projection of the first bridging part on the base substrate, and the orthographic projection of the first power line on the base substrate is located on a side where the orthographic projection of the first bridging part on the base substrate is away from the orthographic projection of the second power line on the base substrate; and wherein in adjacent columns of pixel driving circuits, an orthographic projection of the first power line in a present column of pixel driving circuits on the base substrate is located between an orthographic projection of the data line in an adjacent column of pixel driving circuits on the base substrate and an orthographic projection of the first bridging part in the present column of pixel driving circuits on the base substrate.

11. The display panel according to claim 1, wherein the pixel driving circuit further comprises a second transistor, a first electrode of the second transistor is connected to the gate of the driving transistor, and a second electrode of the second transistor is connected to a second electrode of the driving transistor; and wherein the display panel further comprises:

an active layer located between the base substrate and the second conductive layer, wherein the active layer comprises a third active part, and the third active part is used to form a channel region of the driving transistor;

a first conductive layer located between the active layer and the second conductive layer, wherein the first conductive layer comprises a third conductive part, an orthographic projection of the third conductive part on the base substrate covers an orthographic projection of the third active part on the base substrate, and the third conductive part is used to form the gate of the driving transistor; and a third conductive layer located between the second conductive layer and the fourth conductive layer, wherein the third conductive layer comprises a first bridging part, and the first bridging part is connected to the third conductive part and the first electrode of the second transistor through a fourth via hole; and wherein the fourth conductive layer further comprises:

a fourth conductive part connected to the first power line, wherein an orthographic projection of the fourth conductive part on the base substrate at least partially overlaps with an orthographic projection of the first bridging part on the base substrate.

12. The display panel according to claim 1, wherein the pixel driving circuit further comprises a first transistor and a seventh transistor, a first electrode of the first transistor is connected to a first initial signal line, a second electrode of the first transistor is connected to the gate of the driving transistor, a first electrode of the seventh transistor is connected to a second initial signal line, and a second electrode of the seventh transistor is connected to the first electrode of the light-emitting unit; and wherein the display panel further comprises:

an active layer located between the base substrate and the second conductive layer, wherein the active layer comprises a first active part and a seventh active part, the first active part is used to form a channel region of the first transistor, and the seventh active part is used to form a channel region of the seventh transistor; and a first conductive layer located between the active layer and the second conductive layer, wherein the first conductive layer comprises:

a first reset signal line, wherein an orthographic projection of the first reset signal line on the base substrate extends along the first direction and covers an orthographic projection of the first active part on the base substrate, and a portion of a structure of the first reset signal line is used to form a gate of the first transistor; and a second reset signal line, wherein an orthographic projection of the second reset signal line on the base substrate extends along the first direction and covers an orthographic projection of the seventh active part on the base substrate, and a portion of a structure of the second reset signal line is used to form a gate of the seventh transistor;

wherein the first direction is a row direction, and in adjacent rows of pixel driving circuits, the second reset signal line in a previous row of pixel driving circuits is shared as the first reset signal line in a present row of pixel driving circuits.

13. The display panel according to claim 12, wherein the active layer further comprises a third active part used to form a channel region of the driving transistor; and wherein the first conductive layer further comprises a third conductive part, wherein an orthographic projection of the third conductive part on the base substrate covers an orthographic projection of the third active part on the base substrate, and the third conductive part is used to form the gate of the driving transistor; and wherein the second conductive layer further comprises:

a first initial signal line, wherein an orthographic projection of the first initial signal line on the base substrate extends along the first direction; and a second initial signal line, wherein an orthographic projection of the second initial signal line on the base substrate extends along the first direction;

wherein in the same row of pixel driving circuits, the orthographic projection of the third conductive part on the base substrate is located between the orthographic projection of the first initial signal line on the base substrate and the orthographic projection of the second initial signal line on the base substrate, and the orthographic projection of the first initial signal line on the base substrate is located on a side where the orthographic projection of the first reset signal line on the base substrate is away from the orthographic projection of the third conductive part on the base substrate; and wherein in adjacent rows of pixel driving circuits, an orthographic projection of the second initial signal line in a previous row of pixel driving circuits on the base substrate is located between an orthographic projection of the first initial signal line in a present row of pixel driving circuits on the base substrate and an orthographic projection of the first reset signal line in the present row of pixel driving circuits on the base substrate.

14. The display panel according to claim 13, wherein the first active part comprises a fourth sub active part and a fifth sub active part, and the active layer further comprises a sixth sub active part connected between the fourth sub active part and the fifth sub active part; and wherein the orthographic projection of the second initial signal line in a previous row of pixel driving circuits on the base substrate at least partially overlaps with an orthographic projection of the sixth sub active part in a present row of pixel driving circuits on the base substrate.

15. The display panel according to claim 1, wherein the pixel driving circuit further comprises a first transistor, a second transistor, a fourth transistor, a fifth transistor, a sixth transistor, and a seventh transistor; and wherein a first electrode of the first transistor is connected to a first initial signal line, and a second electrode of the first transistor is connected to the gate of the driving transistor;

a first electrode of the second transistor is connected to the gate of the driving transistor, and a second electrode of the second transistor is connected to a second electrode of the driving transistor;

a first electrode of the fourth transistor is connected to a data line, and a second electrode of the fourth transistor is connected to a first electrode of the driving transistor;

a first electrode of the fifth transistor is connected to a second power line, and a second electrode of the fifth transistor is connected to the first electrode of the driving transistor;

a first electrode of the sixth transistor is connected to the second electrode of the driving transistor, and a second electrode of the sixth transistor is connected to the first electrode of the light-emitting unit;

a first electrode of the seventh transistor is connected to a second initial signal line, and a second electrode of the seventh transistor is connected to the first electrode of the light-emitting unit; and the first transistor, the second transistor, the driving transistor, the fourth transistor, the fifth transistor, the sixth transistor, and seventh transistor are all P-type transistors.

16. The display panel according to claim 15, further comprising:

an active layer located between the base substrate and the second conductive layer, wherein the active layer comprises a third active part, a fourth active part, a fifth active part, a sixth active part, and a seventh active part, and wherein the third active part is used to form a channel region of the driving transistor, the fourth active part is used to form a channel region of the fourth transistor, the fifth active part is used to form a channel region of the fifth transistor, the sixth active part is used to form a channel region of the sixth transistor, and the seventh active part is used to form a channel region of the seventh transistor; and a first conductive layer located between the active layer and the second conductive layer, wherein the first conductive layer comprises:

a gate line, wherein an orthographic projection of the gate line on the base substrate extends along the first direction and covers an orthographic projection of the fourth active part on the base substrate, and a portion of a structure of the gate line is used to form a gate of the fourth transistor;

an enabling signal line, wherein an orthographic projection of the enabling signal line on the base substrate extends along the first direction and covers an orthographic projection of the fifth active part on the base substrate and an orthographic projection of the sixth active part on the base substrate, a portion of a structure of the enabling signal line is used to form a gate of the fifth transistor, and the other portion of the structure of the enabling signal line is used to form a gate of the sixth transistor;

a second reset signal line, wherein an orthographic projection of the second reset signal line on the base substrate extends along the first direction and covers an orthographic projection of the seventh active part on the base substrate, and a portion of a structure of the second reset signal line is used to form a gate of the seventh transistor; and a third conductive part, wherein an orthographic projection of the third conductive part on the base substrate covers an orthographic projection of the third active part on the base substrate, and the third conductive part is used to form the gate of the driving transistor;

wherein in the same row of pixel driving circuits, the orthographic projection of the enabling signal line on the base substrate is located between the orthographic projection of the third conductive part on the base substrate and the orthographic projection of the second reset signal line on the base substrate.

17. A display device comprising a display panel, wherein the display panel comprises sub pixel units arranged in an array along a first direction and a second direction intersecting with the first direction, and wherein each of the sub pixel units comprises a pixel driving circuit and a light-emitting unit, the pixel driving circuit is connected to a first electrode of the light-emitting unit, the pixel driving circuit comprises a driving transistor and a capacitor, a first electrode of the capacitor is connected to one of multiple first power lines, and a second electrode of the capacitor is connected to a gate of the driving transistor, and wherein the display panel further comprises:

a base substrate;

a second conductive layer located on a side of the base substrate, wherein the second conductive layer comprises multiple first conductive parts, each of the multiple first conductive parts is arranged in correspondence with the pixel driving circuit, and the first conductive part is used to form the first electrode of the capacitor in the pixel driving circuit corresponding thereto;

a fourth conductive layer located on a side of the second conductive layer away from the base substrate, wherein the fourth conductive layer comprises the multiple first power lines, orthographic projections of the first power lines on the base substrate are distributed in a spaced manner along the first direction and extend along the second direction, and the first conductive part is connected to the first power line through a first via hole; and a common electrode layer located on a side of the fourth conductive layer away from the base substrate, wherein the common electrode layer is used to form a second electrode of the light-emitting unit, and the first power line is connected to the common electrode layer through a second via hole;

wherein at least a portion of the first conductive parts arranged along the first direction are connected in sequence to form at least one first conductive line, and the first conductive line is connected to the multiple first power lines.

18. The display device according to claim 17, wherein all of the first conductive parts arranged along the first direction are connected in sequence to form the first conductive line, and the first conductive line is connected to each of the first power lines.

19. The display device according to claim 17, wherein multiple of the first conductive parts arranged along the first direction form multiple first conductive lines distributed in a spaced manner along the first direction, and wherein two first conductive lines adjacent in both the first direction and the second direction are distributed in an interlaced manner along the first direction, and the two first conductive lines distributed in an interlaced manner are jointly connected to at least two of the first power lines.

20. The display device according to claim 17, wherein the pixel driving circuit further comprises a sixth transistor, a first electrode of the sixth transistor is connected to a second electrode of the driving transistor, a second electrode of the sixth transistor is connected to the first electrode of the light-emitting unit, and the sixth transistor is a P-type transistor, and wherein the first power line is used to provide a low-level power supply signal; and wherein the display panel further comprises:

an active layer located between the base substrate and the second conductive layer, wherein the active layer comprises a sixth active part, and the sixth active part is used to form a channel region of the sixth transistor, and wherein the orthographic projections of the first power lines on the base substrate at least partially overlap with an orthographic projection of the sixth active part on the base substrate.

\*　\*　\*　\*　\*